(12) United States Patent
Makita et al.

(10) Patent No.: US 6,998,641 B2
(45) Date of Patent: Feb. 14, 2006

(54) SEMICONDUCTOR DEVICE HAVING AN EFFICIENT GETTERING REGION

(75) Inventors: Naoki Makita, Nara (JP); Misako Nakazawa, Kanagawa (JP); Hideto Ohnuma, Kanagawa (JP); Takuya Matsuo, Osaka (JP)

(73) Assignees: Semiconductor Energy Laboratory Co., Ltd., Kanagawa-ken (JP); Sharp Kabushiki Kaisha, Osaka (JP)

( * ) Notice: Subject to any disclaimer, the term of this patent is extended or adjusted under 35 U.S.C. 154(b) by 152 days.

(21) Appl. No.: 10/183,056

(22) Filed: Jun. 27, 2002

(65) Prior Publication Data

US 2003/0025158 A1 Feb. 6, 2003

(30) Foreign Application Priority Data

Jun. 28, 2001 (JP) ........................... 2001-195869

(51) Int. Cl.
H01L 31/112 (2006.01)

(52) U.S. Cl. .................. 257/66; 257/69; 257/70
(58) Field of Classification Search .................. 257/51, 257/66, 68, 69, 70, 71, 72, 75
See application file for complete search history.

(56) References Cited

U.S. PATENT DOCUMENTS

| | | | |
|---|---|---|---|
| 5,501,989 A | | 3/1996 | Takayama et al. |
| 5,563,426 A | * | 10/1996 | Zhang et al. .................. 257/66 |
| 5,589,694 A | | 12/1996 | Takayama et al. |
| 5,643,826 A | | 7/1997 | Ohtani et al. |
| 5,744,822 A | | 4/1998 | Takayama et al. |
| 6,031,249 A | * | 2/2000 | Yamazaki et al. ............. 257/66 |
| 6,072,193 A | * | 6/2000 | Ohnuma et al. ............... 257/57 |
| 6,197,626 B1 | | 3/2001 | Yamazaki et al. |
| 6,251,712 B1 | | 6/2001 | Tanaka et al. |
| 6,278,131 B1 | | 8/2001 | Yamazaki et al. |
| 6,278,132 B1 | | 8/2001 | Yamazaki et al. |
| 6,294,441 B1 | | 9/2001 | Yamazaki |
| 6,465,288 B1 | * | 10/2002 | Ohnuma ..................... 438/166 |
| 6,620,711 B2 | | 9/2003 | Yamazaki |
| 6,693,299 B1 | * | 2/2004 | Yamazaki et al. ............ 257/66 |
| 2001/0016376 A1 | | 8/2001 | Yamazaki et al. |
| 2001/0029070 A1 | | 10/2001 | Yamazaki et al. |
| 2001/0038127 A1 | | 11/2001 | Yamazaki et al. |
| 2001/0048115 A1 | | 12/2001 | Yamazaki et al. |
| 2002/0004291 A1 | | 1/2002 | Yamazaki |
| 2002/0053671 A1 | * | 5/2002 | Koyama ....................... 257/66 |
| 2002/0053674 A1 | * | 5/2002 | Nakajima et al. ............. 257/72 |

FOREIGN PATENT DOCUMENTS

| | | |
|---|---|---|
| EP | 0 862 201 A3 | 9/1998 |
| EP | 0 862 201 A2 | 9/1998 |
| EP | 1 020 920 A2 | 7/2000 |
| EP | 1 020 920 A3 | 4/2002 |
| JP | 07-130652 A | 5/1995 |
| JP | 10-125926 A | 5/1998 |
| JP | 11-054760 A | 2/1999 |
| JP | 2000-133594 | 5/2000 |
| JP | 2001-155995 | 6/2001 |

OTHER PUBLICATIONS

U.S. Appl. No. 09/123,000, filed Jul. 28, 1998 (740756–1845).

* cited by examiner

*Primary Examiner*—Eddie Lee
*Assistant Examiner*—Douglas W. Owens
(74) *Attorney, Agent, or Firm*—Nixon Peabody LLP; Jeffrey L. Costellia

(57) ABSTRACT

In order to solve the problem of inferior gettering efficiency in the n-channel TFT, the present invention provides at an end of the source/drain regions of the n-channel TFT a highly efficient gettering region that contains both of an n-type impurity and a p-type impurity with the concentration of the p-type impurity set higher than the concentration of the n-type impurity.

13 Claims, 16 Drawing Sheets

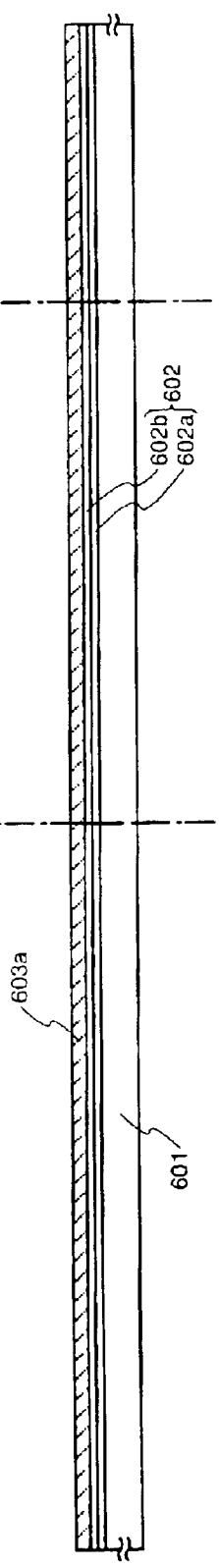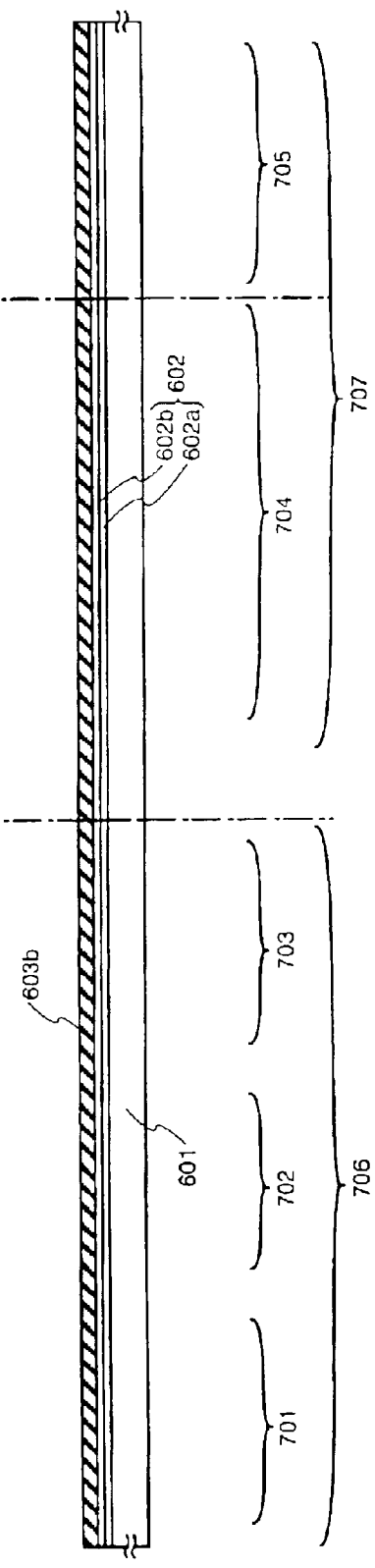

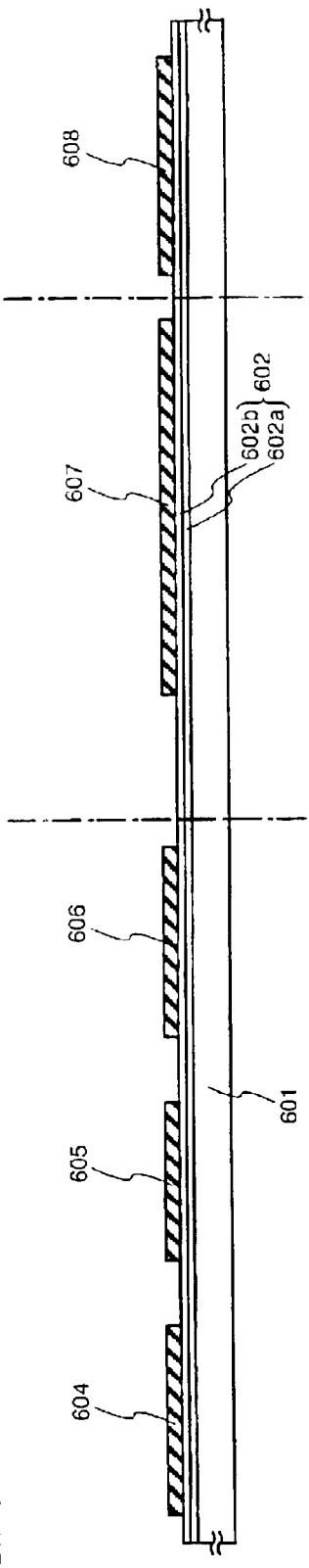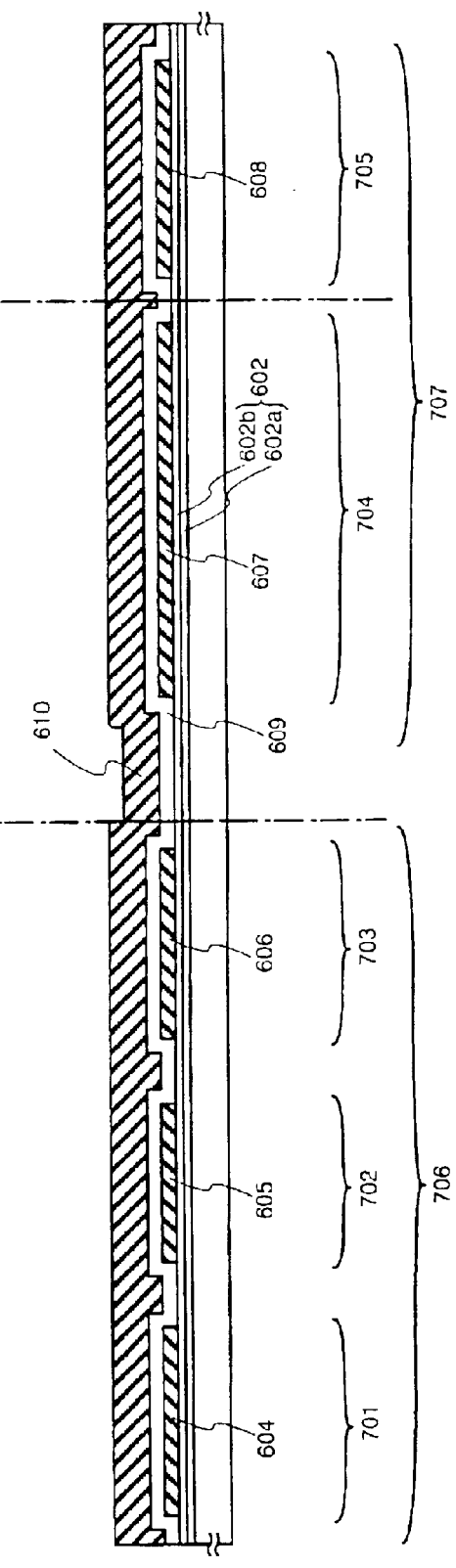
FIG. 9A
FIG. 9B

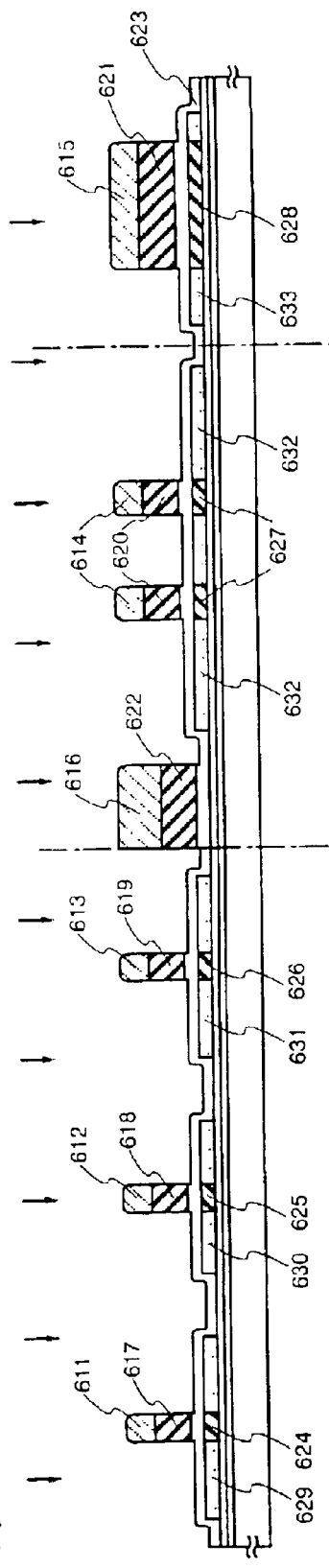
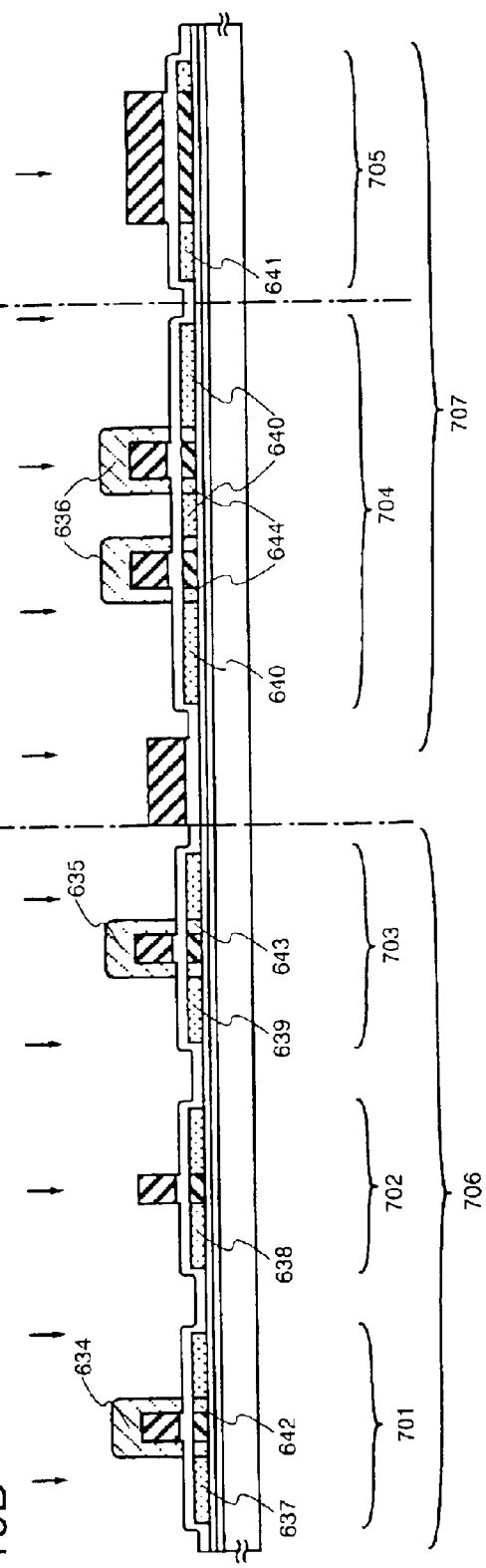
FIG. 10A
FIG. 10B

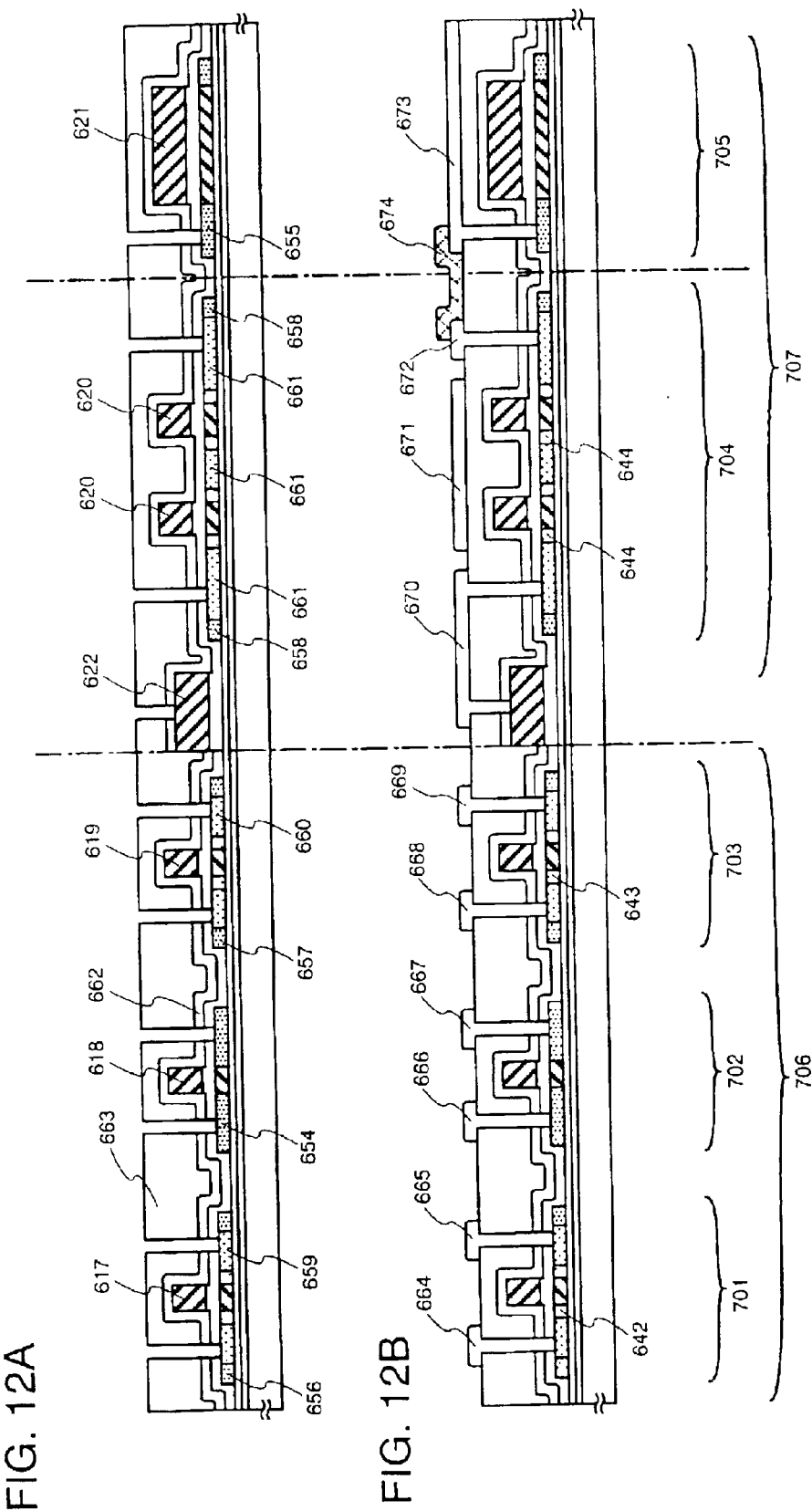

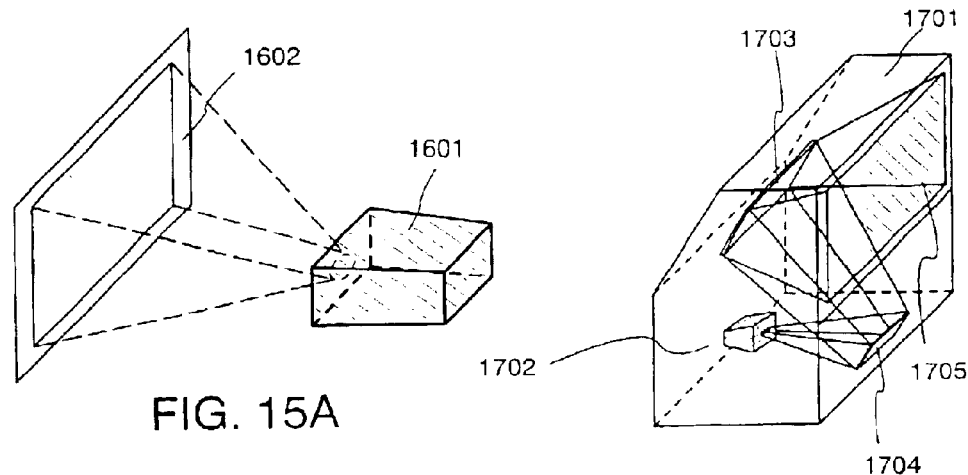
FIG. 15A
FIG. 15B
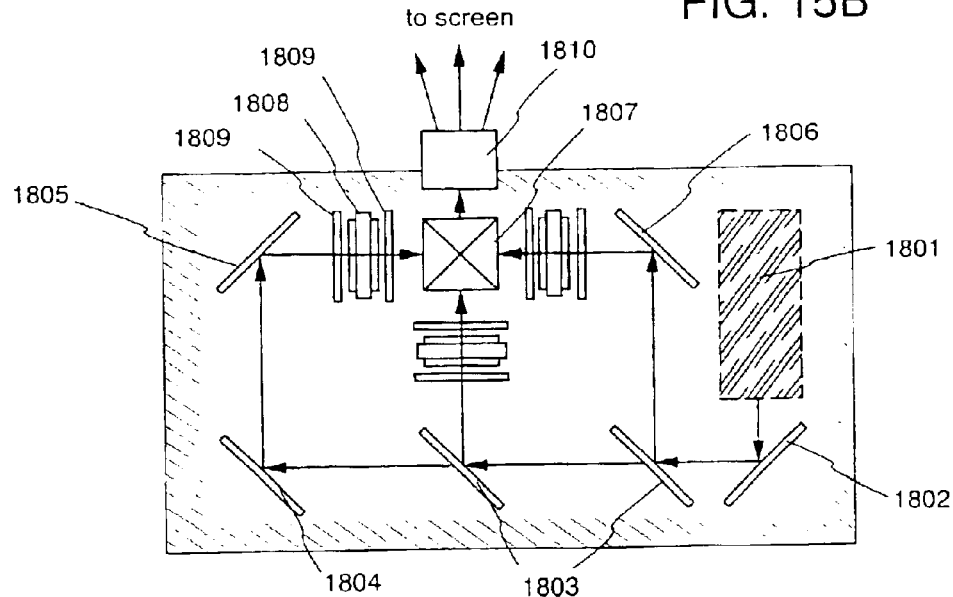
FIG. 15C
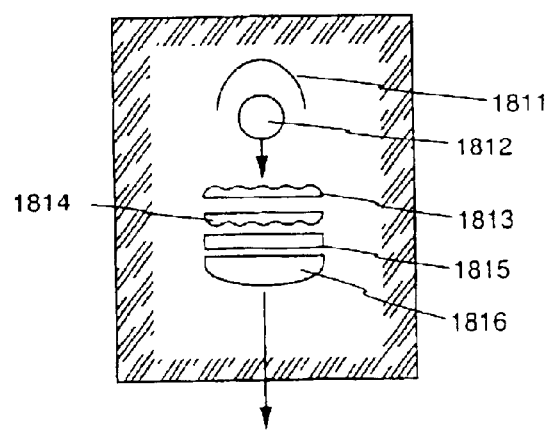
FIG. 15D

SEMICONDUCTOR DEVICE HAVING AN EFFICIENT GETTERING REGION

BACKGROUND OF THE INVENTION

1. Field of the Invention

The present invention relates to a semiconductor device using a crystalline semiconductor film that contains silicon and to a method of manufacturing the semiconductor device. Specifically, the present invention relates to a semiconductor device having an n-channel thin film transistor (hereinafter referred to as TFT) formed from a crystalline semiconductor film that contains silicon and to a method of manufacturing the semiconductor device.

2. Description of the Related Art

In recent years, the technique of making a semiconductor circuit from TFTs formed on an insulating substrate such as a glass substrate has rapidly progressed and is utilized to manufacture active matrix liquid crystal display devices and other electrooptical devices. An active matrix liquid crystal display device is a monolithic liquid crystal display device in which a pixel matrix circuit and a driver circuit are placed on the same substrate. The above technique is also utilized to develop a system on panel incorporating logic circuits such as a γ correction circuit, a memory circuit, and a clock generating circuit.

Driver circuits and logic circuits as above need to operate at high speed. Therefore, it is inappropriate to use an amorphous silicon film for the semiconductor layer that serves as an active layer of a TFT of these circuits. TFTs whose active layers are polycrystalline silicon films are thus becoming the mainstream. There is a need for a glass substrate as a substrate on which TFTs are formed because of its inexpensiveness, and a low temperature process applicable to a glass substrate is actively being developed.

One of the low temperature process techniques that have been developed is a technique for forming a crystalline silicon film on a glass substrate, which is disclosed in Japanese Patent Application Laid-open No. Hei 7-130652. According to the technique described in the publication, an amorphous silicon film is provided with a catalytic element that accelerates crystallization and the amorphous silicon film is then crystallized by heat treatment. This crystallization technique makes it possible to lower the temperature at which an amorphous silicon film is crystallized and shorten the crystallization time. The technique allows a glass substrate with a low heat resistance to have a large area crystalline silicon film on its surface, opening the gate to employment of glass substrate of crystalline silicon film in TFTs.

This technique of crystallizing an amorphous silicon film uses as the catalytic element Ni (nickel), Co (cobalt), or the like. Therefore, when used in a TFT, a crystalline silicon film obtained by this crystallization technique can affect electric characteristics and reliability of the TFT. In fact, it has been confirmed that the catalytic element remaining in the crystalline silicon film segregates irregularly in a grain boundary and that the grain boundary region in which the catalytic element segregates serves as a leak path of a weak current to cause an eruptive increase in OFF current in the TFT. Then, a technique of gettering a catalytic element by a halogen element has been developed (See Japanese Patent Application Laid-open No. Hei 10-125926). This gettering technique requires high temperature heat treatment at 800° C. or higher and is not applicable to a glass substrate having a low heat resistance. Although the technique is capable of lowering the crystallization temperature for obtaining a crystalline silicon film than the heat resistance temperature of a glass substrate, the temperature during gettering of catalytic element by the technique is no lower than 800° C. to make it practically impossible to apply the low temperature process using a catalytic element to a glass substrate.

Against this background, a highly efficient catalytic element gettering technique has been developed and disclosed in Japanese Patent Application Laid-open No. Hei 11-054760. According to the technique described in the publication, catalytic elements in a gettering subject region (a region that is not doped with a Group 13 element and a Group 15 element) are thermally diffused and moved to a gettering region, and the catalytic elements are then gettered in the gettering region by a Group 13 element (typically boron (B)) and a Group 15 element (typically, phosphorus (P)). This technique consists of the following three steps.

The first step is to obtain a crystalline silicon film by crystallizing an amorphous silicon film using a catalytic element. The second step is to form a gettering region by selectively doping the crystalline silicon film with a Group 13 element (typically B) and a Group 15 element (typically P). The third step is to move catalytic elements in a gettering subject region to a gettering region through thermal diffusion induced by heat treatment for gettering.

In applying the above gettering technique to a process of manufacturing a TFT, there are three major application modes given below.

According to Application Mode 1, a gettering subject region is a region including a semiconductor layer formed from a crystalline silicon film and composed of a source region, drain region, and channel region of a TFT. A region in the periphery of the gettering subject region is selectively doped with both a Group 13 element (typically B) that imparts the p-type conductivity and a Group 15 element (typically P) that imparts the n-type conductivity, thereby forming a gettering region. Then, heat treatment is conducted for gettering.

According to Application Mode 2, the entire region of a crystalline silicon film except a channel region is a gettering region. In other words, a source region and a drain region, and regions other than a semiconductor layer make the gettering region. Specifically, this application mode is comprised of: a step of forming a resist mask on a region that serves as the channel region of the TFT after the crystalline silicon film is formed using a catalytic element (before the semiconductor layer is formed); a doping step using both a Group 13 element (typically B) that imparts the p-type conductivity and a Group 15 element (typically P) that imparts the n-type conductivity; a step of removing the resist mask; and a gettering step for gettering the catalytic element from the region serving as the channel region through heat treatment. Since the gettering region includes a part of the source region and drain region, Application Mode 2 can have a larger gettering region as compared to Application Mode 1.

According to Application Mode 3, a channel region in a semiconductor layer that is formed from a crystalline silicon film is a gettering subject region whereas a source region and a drain region in the semiconductor layer alone make a gettering region. Impurity elements in the source region and drain region double as gettering sources. Specifically, this application mode is comprised of: a step of forming the semiconductor layer after the crystalline silicon film is formed using a catalytic element; a step of forming a gate electrode; a step of doping the semiconductor layer with a Group 13 element (typically B) that imparts the p-type conductivity and a Group 15 element (typically P) that imparts the n-type conductivity while using the gate electrode as a mask to form the source region and the drain region; and a step of thermally activating impurity elements in the source region and drain region and simultaneously gettering the catalytic element in the channel region through heat treatment. Since the gettering region is confined to the semiconductor layer and is smaller in surface area as compared to Application Mode 2, Application Mode 3 is that much less effective in gettering the catalytic element in the channel region. On the other hand, Application Mode 3 integrates the step of introducing a gettering source for forming a gettering region with the impurity doping step for forming a source region and a drain region and is therefore advantageous in improving throughput.

Application Mode 3 improves the degree of integration of TFT as well as throughput and is therefore convenient and useful. However, when Application Mode 3 is employed in manufacture of an n-channel TFT and a p-channel TFT, the catalytic element gettering efficiency in a channel region is lower in the n-channel TFT than in the p-channel TFT. The problem of Application Mode 3 regarding the low gettering efficiency of the n-channel TFT will be described in detail below.

Semiconductor layers of the n-channel TFT and p-channel TFT are doped with an n-type impurity element that imparts the n-type conductivity while using gate electrodes as masks. Thereafter, the semiconductor layer of the p-channel TFT alone is doped with a p-type impurity element that imparts the p-type conductivity in an amount large enough to convert the layer's conductivity while using the gate electrode as a mask. Thus formed are source regions and drain regions of the n-channel TFT and p-channel TFT. The source region and drain region of the p-channel TFT therefore contain an element that imparts the n-type conductivity and an element that imparts the p-type conductivity with the amount of p-type impurity exceeding the amount of n-type impurity. On the other hand, the source region and drain region of the n-channel TFT contain only an element that imparts the n-type conductivity. During the gettering treatment that doubles as impurity ion activation treatment, the catalytic element in the channel region of the p-channel TFT is gettered by the element that imparts the n-type conductivity and the element that imparts the p-type conductivity and is contained in an amount exceeding the amount of n-type impurity. The catalytic element in the n-channel TFT, on the other hand, is gettered solely by the element that imparts the n-type conductivity.

It has been confirmed that the gettering efficiency is higher when an element that imparts the n-type conductivity and an element that imparts the p-type conductivity and is contained in a concentration exceeding the concentration of n-type impurity both participate in gettering than when the gettering source consists solely of the element that imparts the n-type conductivity (See Japanese Patent Application Laid-open No. Hei 11-054760). In other words, an n-channel TFT with the gettering source consisting of the element that imparts the n-type conductivity alone is inferior to a p-channel TFT in terms of efficiency in gettering catalytic element of its channel region.

When the effect of gettering catalytic element in a channel region is lower in an n-channel TFT than in a p-channel TFT, gettering in the n-channel TFT could be insufficient and it may be necessary to change gettering treatment conditions so as to avoid insufficient gettering. Therefore, it can be said that the problem regarding gettering efficiency of an n-channel TFT is accompanied with a process margin problem of gettering treatment.

SUMMARY OF THE INVENTION

The present invention has been made in view of the above, and an object of the present invention is therefore to solve the above problems in prior art. More specifically, an object of the present invention is to solve the problem of inferior efficiency in gettering of catalytic element in a channel region of an n-channel TFT to the gettering efficiency in a p-channel TFT. Another object of the present invention is to solve a process margin problem of gettering treatment which accompanies the gettering efficiency problem.

[Structure of n-channel TFT]

First, means to solve the problems of prior art will be described from the aspect of the structure of n-channel TFT.

It has been disclosed in Japanese Patent Application Laid-open No. Hei 11-054760 that the presence of both an element that imparts the n-type conductivity and an element that imparts the p-type conductivity and contained in a concentration larger than the concentration of the n-type impurity in a gettering region is effective in improving the gettering efficiency. The publication studies the gettering efficiency of when a gettering region has both an element that imparts the n-type conductivity (n-type impurity) and an element that imparts the p-type conductivity (p-type impurity), and discloses conclusions about a proper concentration range for improving the gettering efficiency. The conclusions are summarized as follows.

The first conclusion is that a preferable catalytic element gettering efficiency is obtained by setting the dose of an element that imparts the n-type conductivity (typically P) and of an element that imparts the p-type conductivity (typically B) both to $1 \times 10^{15}$ atoms/cm$^2$ or higher in a doping device when the concentration of catalytic element (typically Ni) is $1 \times$ to $2 \times 10$ atoms/cm$^3$. The second conclusion is that a preferable catalytic element (typically Ni) gettering efficiency is obtained by setting the dose of an element that imparts the p-type conductivity (typically B) equal to or larger than the dose of an element that imparts the n-type conductivity (typically P), and that 1 to 3 times larger dose is suitable considering the productivity.

From the first conclusion and the second conclusion, an appropriate range of the dose of element that imparts the n-type conductivity (typically P) is $1 \times 10^{14}$ to $1 \times 10^{16}$ atoms/cm$^2$, and an appropriate range of the dose of element that imparts the p-type conductivity (typically B) is $1 \times 10^{14}$ to $3 \times 10^{16}$ atoms/cm$^2$. When an element that imparts the p-type conductivity and an element that imparts the n-type conductivity are used in the above ranges of dose and the conditions in the second conclusion are met, the gettering efficiency can be improved.

The above study shows that an n-channel TFT, whose source region and drain region contain only an element that imparts the n-type conductivity, has an inferior gettering efficiency in a channel region to the gettering efficiency of a p-channel TFT whose source region and drain region contain an element that imparts the n-type conductivity and an element that imparts the p-type conductivity with the concentration of the p-type impurity higher than the concentration of the n-type impurity. One measure to counter the problem of inferior gettering efficiency in the n-channel TFT is to provide in a part of the source region and drain region a highly efficient gettering region containing an element that imparts the n-type conductivity and an element that imparts the p-type conductivity with the concentration of the p-type impurity higher than the concentration of the n-type impurity.

In this countermeasure, the gettering efficiency in the channel region of the n-channel TFT basically depends on the area of the highly efficient gettering region. Accordingly, a larger area is better for the highly efficient gettering region in principal. It is necessary to form as large a highly efficient gettering region as possible within the confines of the semiconductor layer that is composed of the channel region, the source region, and the drain region.

The highly efficient gettering region on the whole has the p-type conductivity since the concentration of p-type impurity that imparts the p-type conductivity is higher than the concentration of n-type impurity that imparts the n-type conductivity in the region. When the highly efficient gettering region is provided in a part of the source region and drain region of the n-channel TFT, unwanted pn junction is formed between the highly efficient gettering region because the rest of the source region and drain region has the n-type conductivity. If the pn junction is positioned to obstruct a current that flows between the source region and the drain region, electric characteristics of the n-channel TFT can be affected. For that reason, the pn junction, namely, the highly efficient gettering region has to be located at a given place in the source region and drain region which does not affect the flow of the current. Specifically, it is necessary to avoid placing the highly efficient gettering region in a region between a contact portion that is connected to the source region and a contact portion that is connected to the drain region because the current that flows between the source region and the drain region flows through the contact portions.

From the reason above, the regions suitable to hold the highly efficient gettering region extend from an end of the semiconductor layer and are ended in front of the contact portions connected to the source region and the drain region. The highly efficient gettering region may be very close to a contact portion to give the highly efficient gettering region as large surface area as possible. In this situation, there is a possibility that the highly efficient gettering region overlaps the contact portion due to alignment error in the photolithography step of the manufacturing process. Therefore, it is necessary to set the alignment accuracy such that the highly efficient gettering region overlaps no more than half the contact portion at worst, and to determine the design distance between a contact portion and the highly efficient gettering region.

In view of the above points, the present invention provides an n-channel TFT structured as follows and a semiconductor device (comprised of an n-channel TFT and a p-channel TFT) to solve the problems of prior art. In patent claims, the format for claiming an n-channel TFT alone is different from the format for claiming a semiconductor device (complementary circuit) that has an n-channel TFT and a p-channel TFT both. The application range of semiconductor device can vary depending on the claim format. For instance, when an n-channel TFT alone is claimed, the application range of semiconductor device includes an NMOS semiconductor device in which TFTs used to construct circuits are all n-channel TFTs and a CMOS circuits in which an n-channel TFT and a p-channel TFT are both used to construct a circuit. This is because the claim does not put any technical limitation on a p-channel TFT. On the other hand, when a semiconductor device having both an n-channel TFT and a p-channel TFT is claimed, the application range of semiconductor device includes a CMOS semiconductor device alone. Therefore, the n-channel TFT and the semiconductor device are separately described in the following.

A structure of the present invention is a semiconductor device (specifically an n-channel TFT) comprising a semiconductor layer, a gate insulating film and a gate electrode, the semiconductor layer being formed from a crystalline silicon film obtained through providing of a catalytic element that accelerates crystallization, the gate electrode being placed above the semiconductor layer with the gate insulating film interposed therebetween, the semiconductor layer having a source region and a drain region to the left and right of the gate electrode, the source region and the drain region (first concentration regions) being doped with an element that imparts the n-type conductivity, and the device is characterized in that the source region and the drain region have, apart from a channel region, a region doped with an element that imparts the n-type conductivity and with an element that imparts the p-type conductivity (second concentration region).

Another structure of the present invention is a semiconductor device (specifically an n-channel TFT) comprising a semiconductor layer, a gate insulating film, a gate electrode, and an interlayer insulating film, the semiconductor layer being formed from a crystalline silicon film obtained through providing of a catalytic element that accelerates crystallization, the gate electrode being placed above the semiconductor layer with the gate insulating film interposed therebetween, the semiconductor layer having a source region and a drain region to the left and right of the gate electrode, the source region and the drain region (first concentration regions) being doped with an n-type impurity that imparts the n-type conductivity, the interlayer insulating film covering the gate electrode and having a pair of contact holes that reaches the source region and the drain region, and the device is characterized in that the source region and the drain region have a region doped with an element that imparts the n-type conductivity and with an element that imparts the p-type conductivity (second concentration region), the second concentration region being positioned so as to avoid being sandwiched between the pair of contact holes.

Another structure of the present invention is a semiconductor device (specifically a complementary circuit having an n-channel TFT and a p-channel TFT both) comprising first and second semiconductor layers and first and second gate electrodes, the semiconductor layers being formed from a crystalline silicon film obtained through providing of a catalytic element that accelerates crystallization, the first and second gate electrodes being respectively placed above the first and second semiconductor layers with a gate insulating film interposed therebetween, and the device is characterized in that:

the first semiconductor layer is for forming an n-channel thin film transistor and has a source region and drain region (first concentration regions) doped with an element that imparts the n-type conductivity;

the second semiconductor layer is for forming a p-channel thin film transistor and has a source region and drain region (second concentration regions) doped with an element that imparts the n-type conductivity and with an element that imparts the p-type conductivity;

the source region and drain region of the first semiconductor layer have, apart from a channel region, a region (second concentration region) doped with an element that imparts the n-type conductivity and with an element that imparts the p-type conductivity.

Another structure of the present invention is a semiconductor device (specifically a complementary circuit having an n-channel TFT and a p-channel TFT both) comprising first and second semiconductor layers and first and second gate electrodes, the semiconductor layers being formed from a crystalline silicon film obtained through providing of a catalytic element that accelerates crystallization, the first and second gate electrodes being respectively placed above the first and second semiconductor layers with a gate insulating film interposed therebetween, and the device is characterized in that:

the first semiconductor layer is for forming an n-channel thin film transistor and has a source region and drain region (first concentration regions) doped with an element that imparts the n-type conductivity;

the second semiconductor layer is for forming a p-channel thin film transistor and has a source region and drain region (second concentration regions) doped with an element that imparts the n-type conductivity and with an element that imparts the p-type conductivity;

contact holes respectively reaching the source regions and drain regions of the first and second semiconductor layers are formed in an interlayer insulating film that covers the first and second gate electrodes; and the source region and drain region of the first semiconductor layer have a region (second concentration region) doped with an element that imparts the n-type conductivity and with an element that imparts the p-type conductivity, the region being positioned so as to avoid being sandwiched between the contact holes.

A second concentration region doped with an element that imparts the n-type conductivity and with an element that imparts the p-type conductivity serves as a highly efficient gettering region. The concentration of catalytic element after gettering is higher in a second concentration region than in a first concentration region.

In the above four structures of the present invention, different formats describe different semiconductor devices and include different semiconductor device application ranges. However, the n-channel TFT and the n-channel TFT in the CMOS semiconductor device have substantially the same structure.

[Method of Manufacturing an n-channel TFT]

Next, means to solve the problems of prior art is described from the aspect of n-channel TFT manufacturing method. Again, the format for claiming an n-channel TFT alone is different from the format for claiming a semiconductor device (complementary circuit) that has an n-channel TFT and a p-channel TFT both, and the application range of semiconductor device can vary depending on the claim format. Therefore, descriptions on manufacture of the n-channel TFT and of the semiconductor device are separately given in the following. Crystallization techniques that utilize crystallization accelerating catalytic elements to form crystalline silicon films are classified into longitudinal growth methods and lateral growth methods. Therefore, a longitudinal growth method is separated from a lateral growth method in the following descriptions on n-channel TFT manufacturing method.

Definitions of longitudinal growth method and lateral growth method are clarified here. A longitudinal growth method is a crystal growth method in which the entire surface of an amorphous silicon film is uniformly provided with a catalytic element before thermal crystallization and crystals grow in a longitudinal direction (perpendicular to the substrate plane) from the surface of the amorphous silicon film provided with the catalytic element. Therefore, this type is called a longitudinal growth method in this specification. A method called as a lateral growth method in this specification is a crystal growth method in which a part of an amorphous silicon film is provided with a catalytic element through an opening region in a mask insulating film before thermal crystallization, and crystallization advances in a lateral direction (parallel to the substrate plane) through thermal diffusion from the opening region toward the surrounding regions. Therefore, this type is called a lateral growth method in this specification.

A structure of the present invention is a method of manufacturing a semiconductor device (longitudinal growth method for manufacturing an n-channel TFT alone), comprising:

a first step of forming an amorphous silicon film on an insulating substrate such as a glass substrate;

a second step of providing the entirety of the amorphous silicon film with a catalytic element that accelerates crystallization;

a third step of subjecting the amorphous silicon film to heat treatment to form a crystalline silicon film;

a fourth step of patterning the crystalline silicon film to form a semiconductor layer;

a fifth step of forming a gate insulating film on the semiconductor layer;

an sixth step of forming a gate electrode above the semiconductor layer with the gate insulating film interposed therebetween;

a seventh step of forming an n-type impurity region by doping the semiconductor layer with an n-type impurity that is an element imparting the n-type conductivity while using the gate electrodes as a mask;

an eighth step of forming a resist pattern that places an opening region in the n-type impurity region apart from a channel region; and an ninth step of using the resist pattern as a mask to dope the n-type impurity region with a p-type impurity that is an element imparting the p-type conductivity.

Another structure of the present invention is a method of manufacturing a semiconductor device (lateral growth method for manufacturing an n-channel TFT alone), comprising:

a first step of forming an amorphous silicon film on an insulating substrate such as a glass substrate;

a second step of forming a mask insulating film and forming an opening region in a part of the mask insulating film;

a third step of providing the top face of the mask insulating film with a catalytic element that accelerates crystallization and selectively providing the catalytic element to a part of the amorphous silicon film through the opening region;

a fourth step of subjecting the amorphous silicon film to heat treatment to form a crystalline silicon film;

a fifth step of removing the mask insulating film that has served as a mask during introduction of the catalytic element;

a sixth step of patterning the crystalline silicon film to form a semiconductor layer;

a seventh step of forming a gate insulating film on the semiconductor layer;

an eighth step of forming a gate electrode above the semiconductor layer with the gate insulating film interposed therebetween;

a ninth step of forming an n-type impurity region by doping the semiconductor layer with an n-type impurity that is an element imparting the n-type conductivity while using the gate electrodes as a mask;

a tenth step of forming a resist pattern that places an opening region in the n-type impurity region apart from a channel region; and an eleventh step of using the resist pattern as a mask to dope the n-type impurity region with a p-type impurity that is an element imparting the p-type conductivity.

Another structure of the present invention is a method of manufacturing a semiconductor device (longitudinal growth method for manufacturing a complementary circuit that has an n-channel TFT and a p-channel TFT both), comprising:

a first step of forming an amorphous silicon film on an insulating substrate such as a glass substrate;

a second step of providing the entirety of the amorphous silicon film with a catalytic element that accelerates crystallization;

a third step of subjecting the amorphous silicon film to heat treatment to form a crystalline silicon film;

a fourth step of patterning the crystalline silicon film to form semiconductor layers for forming an n-channel TFT and a p-channel TFT;

a fifth step of forming a gate insulating film on the semiconductor layer;

an sixth step of forming a gate electrode above the semiconductor layers with the gate insulating film interposed therebetween;

a seventh step of forming an n-type impurity region by doping the semiconductor layers with an n-type impurity that is an element imparting the n-type conductivity while using the gate electrodes as a mask;

an eighth step of forming a resist pattern that places an opening region in the n-type impurity region for forming the n-channel TFT apart from a channel region, and sets the entire region of the semiconductor layer for forming the p-channel TFT as an opening region; and an ninth step of using the resist pattern as a mask to dope the n-type impurity region with a p-type impurity that is an element imparting the p-type conductivity.

Another structure of the present invention is a method of manufacturing a semiconductor device (lateral growth method for manufacturing a complementary circuit that has an n-channel TFT and a p-channel TFT both), comprising:

a first step of forming an amorphous silicon film on an insulating substrate such as a glass substrate;

a second step of forming a mask insulating film and forming an opening region in a part of the mask insulating film;

a third step of providing the top face of the mask insulating film with a catalytic element that accelerates crystallization and selectively providing the catalytic element to a part of the amorphous silicon film through the opening region;

a fourth step of subjecting the amorphous silicon film to heat treatment to form a crystalline silicon film;

a fifth step of removing the mask insulating film that has served as a mask during providing of the catalytic element;

a sixth step of patterning the crystalline silicon film to form semiconductor layers for forming an n-channel TFT and a p-channel TFT;

a seventh step of forming a gate insulating film on the semiconductor layer;

an eighth step of forming a gate electrode above the semiconductor layers with the gate insulating film interposed therebetween;

a ninth step of forming an n-type impurity region by doping the semiconductor layers with an n-type impurity that is an element imparting the n-type conductivity while using the gate electrodes as a mask;

a tenth step of forming a resist pattern that places an opening region in the n-type impurity region for forming the n-channel TFT apart from a channel region, and sets the entire region of the semiconductor layer for forming the p-channel TFT as an opening region; and an eleventh step of using the resist pattern as a mask to dope the n-type impurity region with a p-type impurity that is an element imparting the p-type conductivity.

In the above manufacturing methods, different formats describe different semiconductor devices and include different semiconductor device application ranges. However, the n-channel TFT and the n-channel TFT in the CMOS semiconductor device are manufactured by substantially the same method.

[Supplement]

Supplementation is made on unclear points in the above descriptions of the structure and manufacturing method of n-channel TFT.

(1) Definition of Crystalline Silicon Film

In this specification, a silicon film having a crystallinity which is obtained by utilizing a crystallization accelerating catalytic element is called a crystalline silicon film and is distinguished from a usual polycrystalline silicon film. The crystalline silicon film is distinguished from a usual polycrystalline silicon film because it is characterized in that its grains are oriented in substantially one direction and it has higher field effect mobility than a usual polycrystalline silicon film.

(2) Catalytic Element Having a Crystallization Accelerating Effect

Catalytic elements that accelerate crystallization are described in Japanese Patent Application Laid-open No. Hei 11-054760. Since the present invention includes the use of catalytic element, an explanation is given anew on catalytic elements. A catalytic element is an element used in providing for crystallizing an amorphous silicon film. Typical catalytic elements are Fe (iron), Co (cobalt), Ni (nickel), Pd (palladium), Pt (platinum), Cu (copper), Au (gold), and the like. Usually, one element selected from the above catalytic elements is used but it is possible to employ a combination of two or more catalytic elements. It has been found that Ni is the most suitable catalytic element out of the above catalytic elements.

(3) Gettering Source Consisting of an Element that Imparts the n-type Conductivity Using a gate electrode as a mask, a semiconductor layer (including a semiconductor layer for forming an n-channel TFT and a semiconductor layer for forming a p-channel TFT) is doped with an element that imparts the n-type conductivity (gettering source). This element is called an n-type impurity and is selected from the group consisting of P (phosphorus), As (arsenic), Sb (antimony), and Bi (bismuth) (N is excluded here). It has been acknowledged that P is the most suitable gettering source considering the effect as a gettering source (Japanese Patent Application Laid-open No. Hei 11-054760).

(4) Gettering Source Consisting of an Element that Imparts the p-type Conductivity An element that imparts the p-type conductivity (gettering source) is called an p-type impurity and is selected from the group consisting of B (boron), Al (aluminum), Ga (gallium), In (indium), and Tl (thallium). It has been acknowledged that B is the most suitable gettering source considering the effect as a gettering source (Japanese Patent Application Laid-open No. Hei 11-054760).

BRIEF DESCRIPTION OF THE DRAWINGS

In the accompanying drawings:

FIGS. 8A and 8B are sectional views showing a process of manufacturing an active matrix liquid crystal display device;

FIGS. 9A and 9B are sectional views showing a process of manufacturing an active matrix liquid crystal display device;

FIGS. 10A and 10B are sectional views showing a process of manufacturing an active matrix liquid crystal display device;

FIGS. 12A and 12B are sectional views showing a process of manufacturing an active matrix liquid crystal display device;

FIGS. 15A to 15D are schematic diagrams of devices showing examples of electronic equipment with a liquid crystal display device incorporated therein.

DETAILED DESCRIPTION OF THE PREFERRED EMBODIMENTS

[Embodiment Mode 1]

This embodiment mode describes an example of semiconductor device that can solve the problem of inferior efficiency in gettering a catalytic element in a channel region of an n-channel TFT to the gettering efficiency in a p-channel TFT. The description is given with reference to FIGS. 1A to 2D.

Figure 1A:
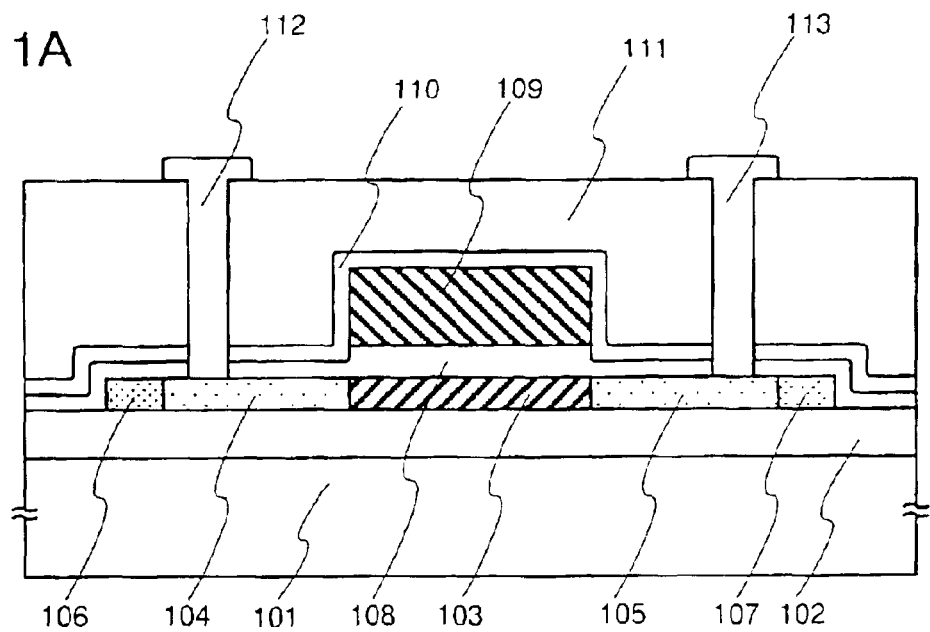
FIGS. 1A and 1B are a sectional view and plan view of an n-channel TFT that has a highly efficient gettering region.

FIG. 1A is a sectional view of an n-channel TFT. Silicon oxynitride is deposited on a glass substrate 101 to have a thickness of 100 nm to form a base film 102. An n-channel TFT is formed on the base film 102. The n-channel TFT on the base film 102 is composed of a semiconductor layer, a gate insulating film 108, and a gate electrode 109 which are layered with the semiconductor layer as the bottom layer and the gate electrode as the top layer. The semiconductor layer is a crystalline silicon film with a thickness of 50 nm. The gate insulating film 108 is a silicon oxide film with a thickness of 100 nm. The gate electrode 109 is formed from a high melting point metal film (typically a W film) with a thickness of 400 nm. The semiconductor layer is not limited to a crystalline silicon film and may be formed of other materials as long as the obtained semiconductor layer has a crystallinity.

The semiconductor layer formed from a crystalline silicon film has a channel region 103 that is a substantially intrinsic region, a source region ($n^+$ region) 104 and drain region ($n^+$ region) 105 that have the n-type conductivity, and highly efficient gettering regions 106 and 107 having the p-type conductivity. The channel region 103 is positioned right below the gate electrode 109. The source region 104 and the drain region 105 are to the left and right of the channel region 103. The highly efficient gettering regions 106 and 107 are on the outer sides of the source and drain regions. (See FIG. 1A)

The source region 104 and the drain region 105 are doped with P that is an n-type impurity in a dose of $1.7 \times 10^{15}$ ions/cm$^2$. The highly efficient gettering regions 106 and 107 are doped with P that is an n-type impurity in a dose of $1.7 \times 10^{15}$ ions/cm$^2$ at the same time the source region 104 and the drain region 105 are doped with P. Thereafter, the highly efficient gettering regions are doped with B that is a p-type impurity in a dose large enough to invert the conductivity, specifically, $2.5 \times 10^{15}$ ions/cm$^2$. (See FIG. 1A)

For reference, secondary ion mass spectroscopy (SIMS) results are shown about the relation between the set dose in a doping device and the concentration of impurities in the crystalline silicon film when the crystalline silicon film is doped with P and B. A sample for the spectroscopy is prepared by forming a crystalline silicon film with a thickness of 50 nm (the same thickness as the crystalline silicon film of this embodiment mode) on a glass substrate and doping the film with P and B each in a dose of $3 \times 10^{15}$ ions/cm$^2$ at an acceleration voltage of 10 kV using a doping device. Samples thus prepared receive SIMS. As a result, it has been confirmed by SIMS that the crystalline silicon film is doped with about $1 \times 10^{15}$ atoms/cm$^2$ of P in terms of dose and that the peak concentration in the crystalline silicon film is about $2 \times 10^{20}$ atoms/cm$^3$. SIMS simultaneously performed on B reveals almost the same results as P, namely, it has been confirmed that the crystalline silicon film is doped with about $1 \times 10^{15}$ atoms/cm$^2$ of B in terms of dose and that the peak concentration in the crystalline silicon film is about $2 \times 10^{20}$ atoms/cm$^3$.

In this embodiment mode, the crystalline silicon film is doped with P in a dose of $1.7 \times 10^{15}$ ions/cm$^2$ and with B in a dose of $2.5 \times 10^{15}$ ions/cm$^2$. Consulting the above SIMS results, the concentration by dose and the peak concentration in the crystalline silicon film are obtained by proportion. It is inferred from the calculation that about $0.6 \times 10^{15}$ ions/cm$^2$ of P in terms of dose is contained and that the peak concentration of P is about $1.1 \times 10^{20}$ atoms/cm$^3$. It is inferred from the calculation that about $0.8 \times 10^{15}$ ions/cm$^2$ of B in terms of dose is contained and that the peak concentration of B is about $1.7 \times 10^{20}$ atoms/cm$^3$.

The thus structured semiconductor layer serves as an active layer of the n-channel TFT. The semiconductor layer is obtained by patterning a crystalline silicon film that is formed by doping an amorphous silicon film having a thickness of 50 nm with a crystallization accelerating catalytic element and then subjecting the amorphous silicon film to heat treatment. Accordingly, a large amount of catalytic elements used during crystallization is contained in the semiconductor layer. The catalytic element employed is a metal element such as Ni or Co. Ni is employed in this embodiment mode. A metal element as a catalytic element forms a deep level in a silicon film to trap carriers. When a crystalline silicon film obtained by using a metal element as a catalytic element forms a semiconductor layer of a TFT, the metal element can affect electric characteristics and reliability of the TFT. Therefore, it is necessary to remove the catalytic element quickly after crystallization or reduce the catalytic element to an amount that does not influence the TFT electrically. (See FIG. 1A)

Based on the above points, a region containing both P that is an n-type impurity and B that is a p-type impurity, namely, the highly efficient gettering regions 106 and 107 are placed apart from channel region 103 in the semiconductor layer, in other words, outside of the source region 104 and drain region 105. During heat treatment for impurity activation as well as for gettering, the catalytic element Ni in the channel region 103 is moved through thermal diffusion to the highly efficient gettering regions 106 and 107 for gettering owing to the efficient gettering action of the highly efficient gettering regions 106 and 107. Ni in the channel region 103 is reduced to an amount that does not electrically influence the TFT by the efficient gettering action. (See FIG. 1A)

A first interlayer insulating film 110 that is a silicon oxynitride film with a thickness of 150 nm is formed on the surface of the n-channel TFT. A second interlayer insulating film 111 that is an acrylic resin film with a thickness of 1.6 μm is laid on top of the first interlayer insulating film to form a laminate. The laminate plus the gate insulating film 108 below the first interlayer insulating film 110 are pierced by contact holes. Metal wiring lines 112 and 113 are formed so as to bury the contact holes. The metal wiring line 112 is electrically connected to the source region 104 whereas the metal wiring line 113 is electrically connected to the drain region 105. (See FIG. 1A)

As has been described, the concentration of B that is a p-type impurity is higher than the concentration of P that is an n-type impurity in the highly efficient gettering regions 106 and 107 to give the regions the p-type conductivity. When the highly efficient gettering regions 106 and 107 are provided in a part of the source region 104 and drain region 105 of the n-channel TFT, unwanted pn junction is formed between the highly efficient gettering regions and the rest of the source region and drain region having the n-type conductivity. If the pn junction is positioned to obstruct a current that flows between the source region 104 and the drain region 105, electric characteristics of the n-channel TFT can be affected. For that reason, the highly efficient gettering regions 106 and 107 have to be located at a position that does not obstruct a current flowing between the source region 104 and the drain region 105, namely, a position that does not block a current flowing through the metal wiring line 112 connected to the source region 104 and through the metal wiring line 113 connected to the drain region 105. (See FIG. 1A)

Figure 1B:
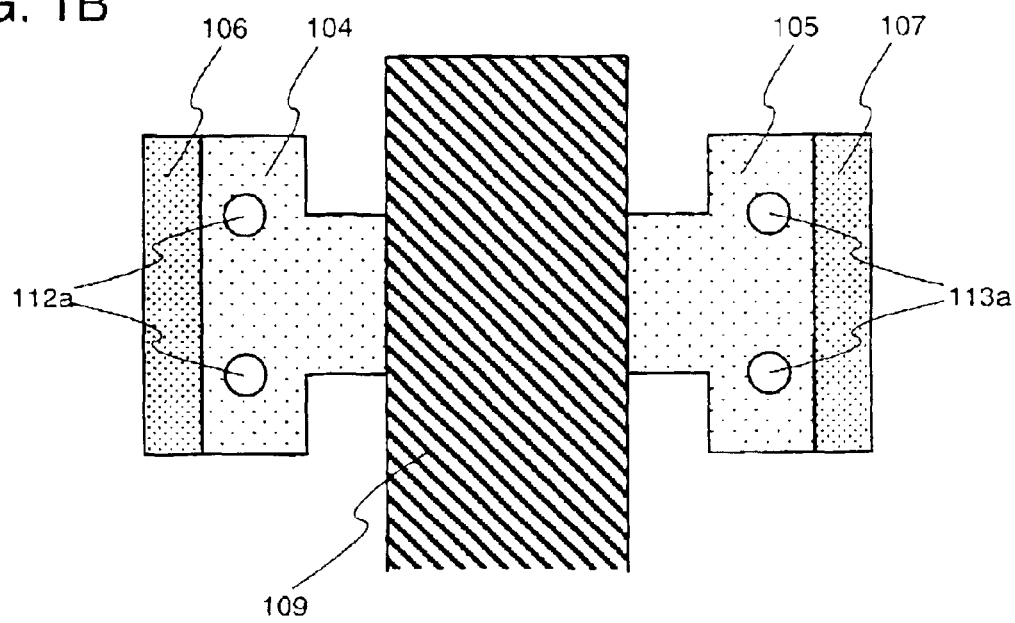

FIG. 1B is a plan view of the n-channel TFT. Symbols used to denote the respective components in FIG. 1B are basically the same as those in the sectional view of the n-channel TFT (FIG. 1A). As shown in FIG. 1B, the highly efficient gettering regions 106 and 107 where both the n-type impurity and p-type impurity are present are positioned so as to avoid obstructing a current flowing through a contact portion 112a that is connected to the source region 104 and through a contact portion 113a that is connected to the drain region 105, namely, on the outer sides of the contact portions 112a and 113a. (See FIG. 1B)

FIGS. 2A to 2D are plan views of n-channel TFTs, showing examples of arrangement of highly efficient gettering regions apart from channel regions in semiconductor layers.

Figure 2A:
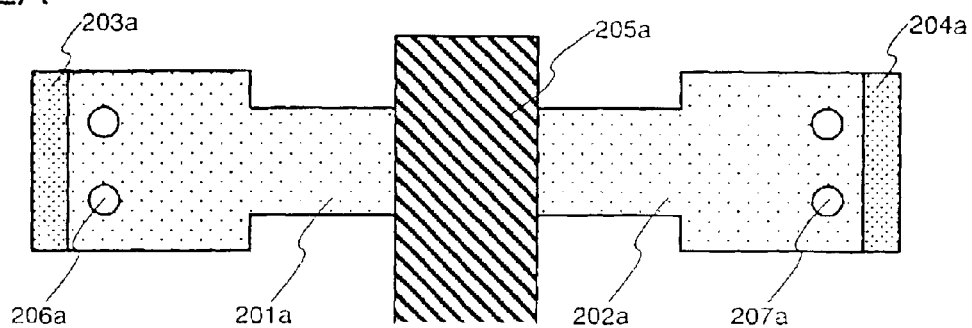
FIGS. 2A to 2D are plan views showing examples of arrangement of highly efficient gettering region in an n-channel TFT.

In the example shown in FIG. 2A, highly efficient gettering regions 203a and 204a where an n-type impurity and a p-type impurity are both present are rectangles with their longer sides set parallel to a gate electrode 205a. The rectangles are apart from a channel region in the semiconductor layer and the outer corners of the rectangles coincide with the outer corners of the semiconductor layer. This arrangement example is identical with the example of the n-channel TFT shown in FIG. 1B. In the example shown in FIG. 2B, highly efficient gettering regions 203b and 204b are rectangles with their longer sides set perpendicular to a gate electrode 205b. The rectangles are apart from a channel region in the semiconductor layer and one corner of each of the rectangles coincides with one corner of the semiconductor layer. In the example shown in FIG. 2C, highly efficient gettering regions 203c and 204c have a complicate shape obtained by combining rectangles whose longer sides are parallel to a gate electrode 205c with rectangles whose longer sides are perpendicular to the gate electrode 205c. The polygons are apart from a channel region in the semiconductor layer and the outer corners of the polygons coincide with the outer corners of the semiconductor layer. This example is characterized by the highly efficient gettering regions having larger area than those in FIGS. 2A and 2B. (See FIGS. 2A to 2C)

Figure 2B:
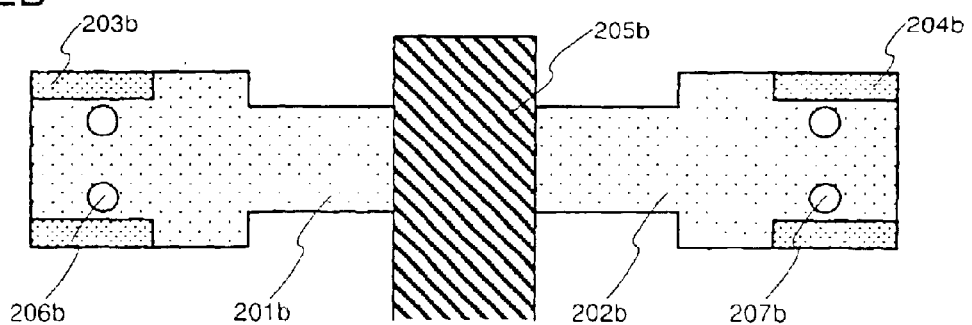
Figure 2C:
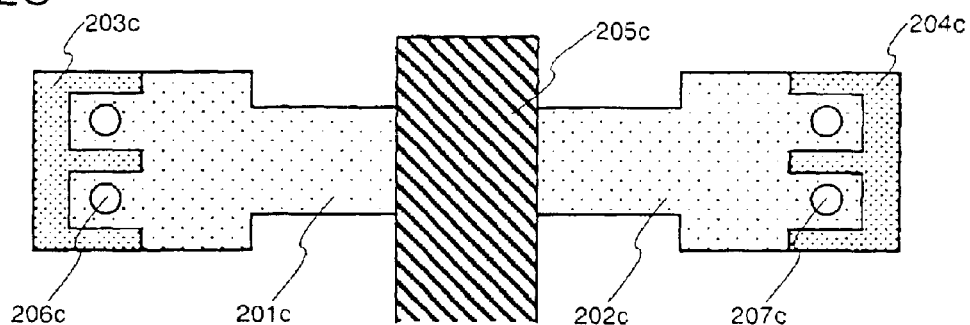

In any of the above arrangement examples, the highly efficient gettering regions are arranged so as to avoid obstructing a current flowing between the contact portion that is connected to the source region and the contact portion that is connected to the drain region. To elaborate, the highly efficient gettering regions 203a and 204a in FIG. 2A are arranged in positions that do not block a current flowing between contact portions 206a connected to a source region 201a and contact portions 207a connected to a drain region 202a. The highly efficient gettering regions 203b and 204b in FIG. 2B are arranged in positions that do not block a current flowing between contact portions 206b connected to a source region 201b and contact portions 207b connected to a drain region 202b. The highly efficient gettering regions 203c and 204c in FIG. 2C are arranged in positions that do not block a current flowing between contact portions 206c connected to a source region 201c and contact portions 207c connected to a drain region 202c. (See FIGS. 2A to 2C)

Figure 2D:
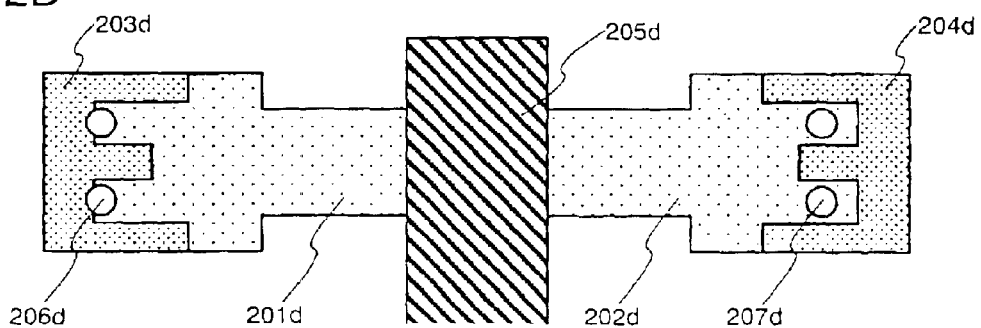
Figure 3A:
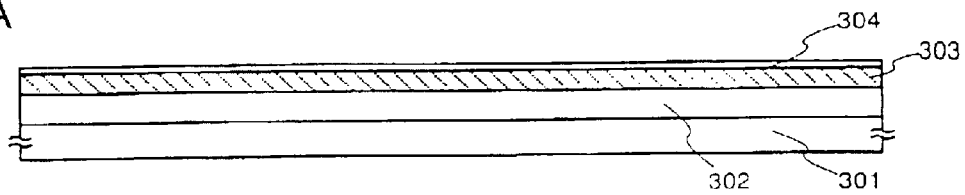
FIGS. 3A to 3F are sectional views showing a process (longitudinal growth method) of manufacturing a semiconductor device that has an n-channel TFT and a p-channel TFT both.
Figure 3B:
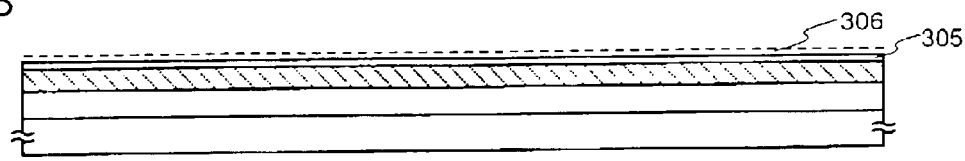
Figure 3C:
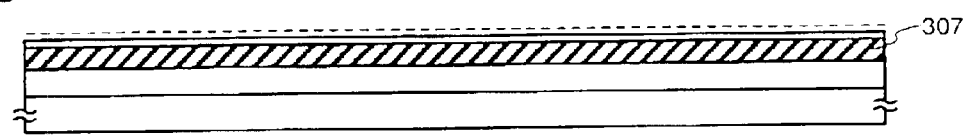
Figure 3D:
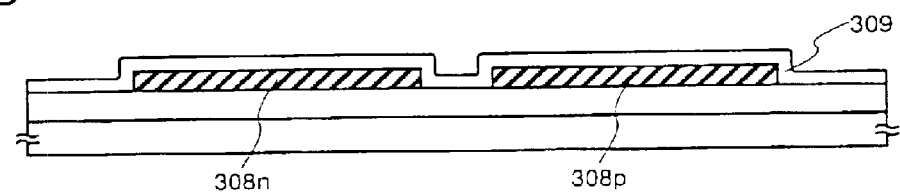
Figure 3E:
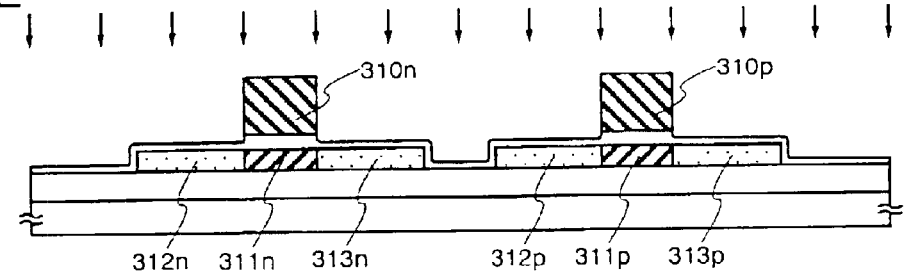
Figure 3F:
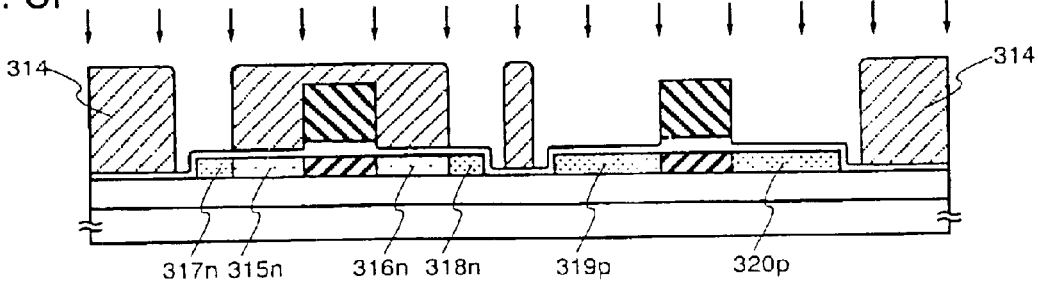

FIG. 2D shows an arrangement example that is basically the same as the example in FIG. 2C. In the example of FIG. 2D, highly efficient gettering regions 203d and 204d are even larger than the highly efficient gettering regions in FIG. 2C in order to enhance the gettering efficiency, and the highly efficient gettering region 203d partially overlaps contact portions 206d. Basically, no problem is caused when the highly efficient gettering regions 203d and 204d partially overlap the contact portions 206d and 207d. However, it is necessary to make sure that the highly efficient gettering regions overlap no more than half the contact portions 206d and 207d at worst. Therefore, the design distances between the contact portions 206d and 207d and the highly efficient gettering regions 203d and 204d has to be set suitably taking into consideration the alignment accuracy of an exposure device that is used in photolithography steps for forming the regions.

Figure 13:
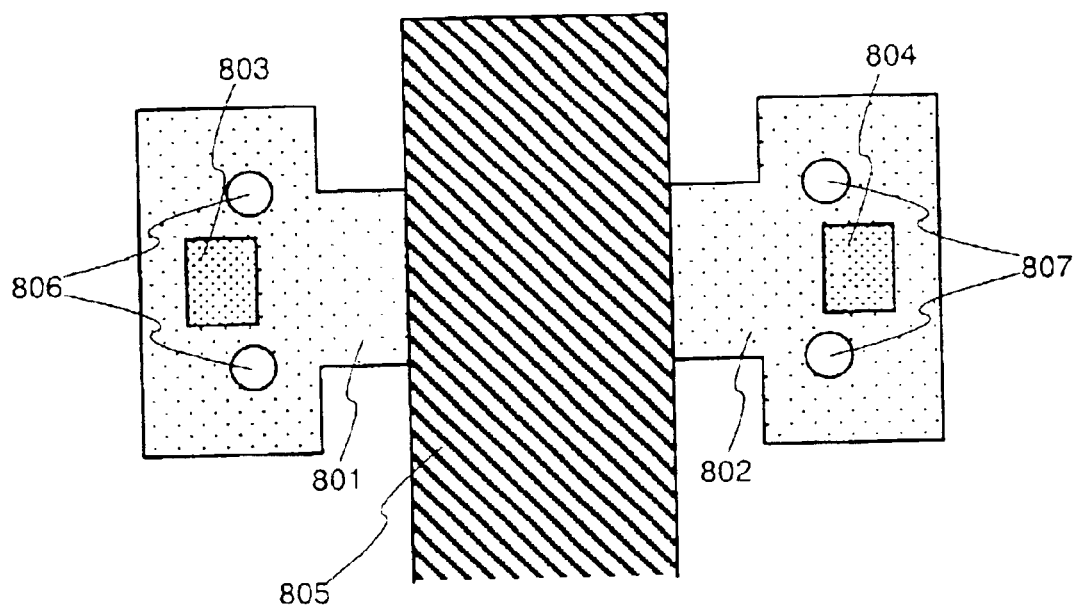
FIG. 13 is a plan view of an n-channel TFT that has a highly efficient gettering region.

The positions of highly efficient gettering regions are not limited to those in this embodiment mode. The highly efficient gettering regions can be provided in any place as long as a current flowing between the source region and the drain region is not affected (as long as the current is not blocked). The highly efficient gettering regions may not always be placed at the ends of the semiconductor layer. The same effect can be obtained when, for instance, highly efficient gettering regions 803 and 804 are placed in regions adjacent to contact portions 806 and 807 that are respectively connected to a source region 801 and a drain region 802 as shown in FIG. 13. A reference numeral 805 denotes a gate electrode. (See FIG. 13)

[Embodiment Mode 2]

This embodiment mode describes a method of manufacturing a semiconductor device that can solve the problem of inferior efficiency in gettering a catalytic element in a channel region of an n-channel TFT to the gettering efficiency in a p-channel TFT. The description is given with reference to FIGS. 3A to 4C.

First, a silicon oxynitride film with a thickness of 100 nm is formed as a base film 302 on a glass substrate 301 by plasma CVD. Then, an amorphous silicon film 303 is immediately formed to have a thickness of 15 to 70 nm, preferably 30 to 60 nm. Plasma CVD is used in this embodiment mode to form the amorphous silicon film 303 to have a thickness of 50 nm, but low pressure CVD may be used instead. During formation of the amorphous silicon film 303, a natural oxide film 304 is formed on the surface by the effect of oxygen in the air. (See FIG. 3A)

The amorphous silicon film 303 is crystallized next. Before crystallization, the contaminated natural oxide film 304 on the surface of the amorphous silicon film 303 is removed by treating the substrate on which the amorphous silicon film 303 is formed with diluted fluoric acid. Then, the amorphous silicon film 303 is irradiated with UV light in an oxygen atmosphere to form a very thin silicon oxide film 305 on the surface of 303. The very thin silicon oxide film 305 has a function of improving the permeability of a Ni aqueous solution that is a catalytic element solution to be applied later by spin coating. (See FIG. 3B)

An aqueous solution of Ni that is a catalytic element is applied to the entire surface of the amorphous silicon film 303 (the surface of the silicon oxide film 305, to be exact) by spin coating. The Ni concentration in the Ni aqueous solution is 0.1 to 50 ppm by weight, preferably 1 to 30 ppm by weight. This concentration range is determined to set the Ni concentration in the amorphous silicon film 303 to $1 \times 10^{15}$ to $6 \times 10^{19}$ atoms/cm$^3$. Here the Ni concentration in the amorphous silicon film is set to $1 \times 10^{15}$ to $6 \times 10^{19}$ atoms/cm$^3$ because it is difficult to obtain the catalytic action of Ni when the concentration thereof is lower than $1 \times 10^{15}$ atoms/cm$^3$. The above Ni concentration is determined by the maximum measurement value by SIMS. (See FIG. 3B)

In this embodiment mode, a Ni aqueous solution containing 10 ppm of Ni is applied by spin coating. During spin coating, the glass substrate 301 is rotated to shake excess Ni aqueous solution off to form a very thin Ni-containing layer 306 on the entire surface of the amorphous silicon film 303 (the surface of the silicon oxide film 305, to be exact). (See FIG. 3B)

Next, the amorphous silicon film 303 is subjected to heat treatment in nitrogen atmosphere at 550° C. for four hours to crystallize the film 303 and form a crystalline silicon film 307. In a crystal growth method like this, where the amorphous silicon film 303 is subjected to heat treatment after applying a Ni aqueous solution to the entire surface of the film 303, crystal growth advances from the surface of the amorphous silicon film 303 doped with Ni toward the base film 302 (longitudinal direction). The method is therefore called a longitudinal growth method in this specification. (See FIG. 3C)

The above heat treatment may be carried out in an electric furnace at 500 to 700° C., preferably 550 to 650° C. The upper limit of the heat treatment temperature has to be set taking into consideration the heat resistance of the substrate used. In the case of the glass substrate 301, for example, glass distortion point is about 600° C. and the glass substrate 301 is noticeably warped or shrunk if heated at a temperature exceeding the glass distortion point. Therefore, the glass substrate 301 has to be subjected to heat treatment at 600° C. or lower. Although this embodiment mode uses an electric furnace for the heat treatment, laser annealing, lamp annealing, or like other heat treatment means may be employed. (See FIG. 3C)

The obtained crystalline silicon film 307 is irradiated with a laser to improve the crystallinity. Heat treatment in an electric furnace only achieves insufficient crystallization of the crystalline silicon film 307, and amorphous components are scatteredly left in the film. Here, insufficient crystallinity is improved by irradiating the crystalline silicon film 307 with a pulse oscillation type KrF excimer laser (wavelength: 248 nm). The excimer laser is oscillated ultraviolet light and therefore instantaneous fusing and solidification is repeated in a laser irradiation subject region. This brings a kind of non-equilibrium state to the laser irradiation subject region and makes it very easy for Ni to move. The laser irradiation step may be omitted but it is preferable to include this step since the laser irradiation step has an effect of improving the efficiency in a later gettering step in addition to improving the crystallinity.

Next, the crystalline silicon film 307 is patterned by normal photolithography treatment and dry etching treatment into a semiconductor layer 308n for forming an n-channel TFT and a semiconductor layer 308p for forming a p-channel TFT. The surfaces of the semiconductor layers 308n and 308p have unwanted natural oxide films, which are removed by diluted fluoric acid treatment. Then, a silicon oxide film is formed as a gate insulating film 309 by plasma CVD or low pressure CVD to have a thickness of 100 nm. (See FIG. 3D)

Next, a conductive film as a gate electrode material is formed (to have a thickness of 400 nm) by sputtering or CVD. The conductive film is then patterned by normal photolithography treatment and dry etching treatment into a gate electrode 310n for the n-channel TFT and a gate electrode 310p for the p-channel TFT. The gate electrode material used here is preferably a heat resistant material that can withstand the temperature (550 to 650° C.) of later heat treatment for gettering as well as for activation of impurity elements. Examples of the heat resistant material include high melting point metals such as Ta (tantalum), Mo (molybdenum), Ti (titanium), W (tungsten), and Cr (chromium), metal suicides that are compounds of high melting point metals and silicon, and polycrystalline silicon having the n-type or p-type conductivity. This embodiment mode employs a metal film (W) with a thickness of 400 nm. (See FIG. 3E)

The gate electrodes 310n and 310p are used as masks to dope the semiconductor layers with P that is an n-type impurity. Doping conditions include setting the acceleration voltage to 60 to 100 kV and the dose to $1.7 \times 10^{15}$ ions/cm$^2$. Through the doping treatment, high concentration impurity regions (n$^+$ regions) 312n and 313n that have the n-type conductivity and function as a source region and a drain region, and a substantially intrinsic region 311n that functions as a channel region are formed in the semiconductor layer 308n for forming the n-channel TFT. High concentration impurity regions (n$^+$ regions) 312p and 313p that have the n-type conductivity and a substantially intrinsic region 311p that functions as a channel region are formed through the doping treatment in the semiconductor layer 308p for forming the p-channel TFT. (See FIG. 3E)

Formed next is a resist pattern 314 that places an opening region at an end apart from the channel region 311n in the semiconductor layer 308n for forming the n-channel TFT, and sets the entire region of the semiconductor layer 308p for forming the p-channel TFT as an opening region. Then, the resist pattern 314 and the gate electrode 310p for the p-channel TFT are used as masks to dope the semiconductor layers with B that is a p-type impurity. Doping conditions include setting the acceleration voltage to 60 to 100 kV and the dose to $2.5 \times 10^{15}$ ions/cm$^2$. Through the doping treatment, the conductivity of the n-type impurity regions 312p and 313p for forming the p-channel TFT is inverted to form high concentration impurity regions (p$^+$ regions) 319p and 320p having the p-type conductivity. At the same time the p-type impurity regions 319p and 320p are formed, the opening region of the resist pattern 314 that is placed apart from the channel region 311n in the semiconductor layer 308n of the n-channel TFT is used as a mask to form high concentration impurity regions (p$^+$ regions) 317n and 318n having the p-type conductivity. (See FIG. 3F)

The high concentration impurity regions (p$^+$ regions) 319p and 320p formed here to have the p-type conductivity are regions functioning as a source region and drain region of the p-channel TFT. Containing the n-type impurity in addition to the p-type impurity, the regions 319p and 320p also function as highly efficient gettering regions for gettering Ni in the substantially intrinsic region 311p that is the channel region. The high concentration impurity regions (p$^+$ regions) 317n and 318n formed apart from the channel region 311n in the semiconductor layer 308n of the n-channel TFT to have the p-type conductivity also function as highly efficient gettering regions for gettering Ni in the substantially intrinsic region 311n that is the channel region. (See FIG. 3F)

After the resist pattern 314 is removed, an inorganic film with a thickness of 100 to 300 nm is formed as a first interlayer insulating film 321. The first interlayer insulating film 321 in this embodiment mode is a silicon oxynitride film formed by plasma CVD to have a thickness of 150 nm. Then, heat treatment is conducted in an electric furnace at 600° C. for 12 hours to activate thermally the impurity elements (n-type impurity and p-type impurity) implanted in the semiconductor layers 308n and 308p. This heat treatment for thermal activation of the impurity elements doubles as gettering treatment for gettering unwanted catalytic element (Ni) contained in the substantially intrinsic regions 311n and 311p that function as the channel regions. The unwanted catalytic element (Ni) contained in the substantially intrinsic regions 311n and 311p that function as the channel regions are thus moved through thermal diffusion to the highly efficient gettering regions 317n, 318n, 319p, and 320p for gettering. A TFT with a crystalline silicon film formed by this method has high field effect mobility and shows excellent electric characteristics including a reduced OFF current value. Thereafter, the semiconductor layers 308n and 308p are subjected to hydrogenation treatment in a nitrogen atmosphere containing 3% of hydrogen at 410° C. for an hour to terminate dangling bonds in the semiconductor layers. (See FIG. 4A)

Next, a transparent organic film is formed as a second interlayer insulating film 322 on the first interlayer insulating film 321 to have a thickness of 1 to 3 μm. The second interlayer insulating film 322 in this embodiment mode is an acrylic resin film with a thickness of 1.6 μm. Then, contact holes 323 are formed by normal photolithography treatment and dry etching treatment in the second interlayer insulating film 322 and the first interlayer insulating film 321 as well as a gate insulating film 309 below the first interlayer insulating film 321. (See FIG. 4B)

A conductive metal film is formed next to have a thickness of 200 to 800 nm. In this embodiment mode, a laminate of a Ti film with a thickness of 50 nm and an Al—Ti alloy film with a thickness of 500 nm is formed by sputtering. Then, metal wiring lines 324 are formed by normal photolithography treatment and dry etching treatment. The metal wiring lines 324 are respectively connected through the contact holes 323 to the source region 315n and drain region 316n for forming the n-channel TFT and to the source region 319p and drain region 320p for forming the p-channel TFT. (See FIG. 4C)

[Embodiment Mode 3]

Embodiment Mode 2 describes a method of manufacturing a semiconductor device which uses a longitudinal growth method to crystallize an amorphous silicon film. As has been mentioned, there is another growth method that can be used to crystallize an amorphous silicon, a lateral growth method. This embodiment mode describes a method of manufacturing a semiconductor device which uses a lateral growth method to crystallize an amorphous silicon film. Specific descriptions on the method are given below with reference to FIGS. 5A to 5F.

First, a silicon oxynitride film with a thickness of 100 nm is formed as a base film 402 on a glass substrate 401 by plasma CVD. Then, an amorphous silicon film 403 is immediately formed to have a thickness of 15 to 70 nm, preferably 30 to 60 nm. Plasma CVD is used in this embodiment mode to form the amorphous silicon film 403 to have a thickness of 50 nm, but low pressure CVD may be used instead. A silicon oxide film is formed as a mask insulating film 404 on the amorphous silicon film 403 by plasma CVD or low pressure CVD to have a thickness of 70 nm. (See FIG. 5A)

An opening region 405 is formed in a part of the mask insulating film 404 by normal photolithography treatment and wet etching treatment. The opening region 405 formed here is for selectively providing a catalytic element (Ni is used in this embodiment mode too) to the amorphous silicon film 403. The amorphous silicon film 403 is exposed at the bottom of the opening region 405. Then, the substrate is oxidized to form a very thin silicon oxide film 0.5 to 5 nm in thickness (not shown) on the exposed region of the amorphous silicon film 403 in the opening region 405. In this embodiment mode, the oxidization treatment is delivered through ozone water treatment by the spin processing method (single wafer method) continued for a given period of time. Batch processing ozone water treatment using a washing tank may be employed for the oxidization treatment. Alternatively, single wafer method or batch processing hydrogen peroxide water treatment may be employed, or the substrate may be oxidized by ozone generated by ultraviolet (UV) irradiation in an oxygen atmosphere. The very thin silicon oxide film (not shown) in the opening region 405 is formed to improve the permeability of a catalytic element solution (typically, a Ni aqueous solution) to the amorphous silicon film 403. (See FIG. 5B)

Next, a Ni aqueous solution as the catalytic element solution is applied by spin coating to the entire surface of the mask insulating film 404 having the opening region 405 to selectively introduce Ni to the amorphous silicon film 403 at the bottom of the opening region 405. In this embodiment mode, the catalytic element solution used is a nickel acetate aqueous solution containing 10 ppm (by weight) of Ni. A very thin Ni-containing layer 406 is formed through the spin coating. (See FIG. 5B)

Next, the amorphous silicon film 403 is subjected to heat treatment in a nitrogen atmosphere at 600° C. for eight hours to crystallize the film 403 and form a crystalline silicon film 407. During crystallization, Ni selectively introduced through the opening region 405 is diffused from the opening region 405 toward the surrounding regions and crystallization of the amorphous silicon film 403 progresses with the advance of diffusion. The crystallization proceeds in the lateral direction (the direction parallel to the substrate), and this method is therefore called a lateral growth method in this specification. (See FIG. 5C)

The obtained crystalline silicon film 407 is irradiated with a laser to improve the crystallinity. The laser irradiation greatly improves the crystallinity of the crystalline silicon film 407. This embodiment mode employs a pulse oscillation type KrF excimer laser (wavelength: 248 nm). The excimer laser not only improves the crystallinity of the crystalline silicon film 407 but also makes it very easy for Ni to move. Therefore, the laser irradiation also has an effect of improving the efficiency in gettering by a gettering source.

The substrate is then treated with diluted fluoric acid to remove the mask insulating film 404 that has been used as a mask for selectively providing Ni. After the mask insulating film 404 is removed, the crystalline silicon film 407 is patterned by normal photolithography treatment and dry etching treatment into a semiconductor layer 408n for forming an n-channel TFT and a semiconductor layer 408p for forming a p-channel TFT. A silicon oxide film with a thickness of 100 nm is formed as a gate insulating film 409 by plasma CVD or low pressure CVD. Before forming the gate insulating film 409, the substrate is washed through diluted fluoric acid treatment to remove contaminants (including a natural oxide film) on the surface of the substrate. (See FIG. 5D)

Descriptions of the following steps are substantially the same as the descriptions on FIGS. 3E and 3F and FIGS. 4A to 4C in Embodiment Mode 2. Therefore, summarized version thereof is given.

A film of W that is a conductive high melting point metal is formed by sputtering or CVD to have a thickness of 400 nm. The W film is patterned by normal photolithography treatment and dry etching treatment into a gate electrode 410n for the n-channel TFT and a gate electrode 410p for the p-channel TFT. Then, the gate electrodes 410n and 410p are used as masks to dope the semiconductor layers with P that is an n-type impurity. Thus formed are high concentration impurity regions ($n^+$ region) 412n, 413n, 412p, and 413p having the n-type conductivity and substantially intrinsic regions 411n and 411p. (See FIG. 5E)

Formed next is a resist pattern 414 that places an opening region at an end apart from the channel region 411n in the semiconductor layer 408n for forming the n-channel TFT, and sets the entire region of the semiconductor layer 408p for forming the p-channel TFT as an opening region. Then, the resist pattern 414 and the gate electrode 410p for the p-channel TFT are used as masks to dope the semiconductor layers with B that is a p-type impurity. Through the doping treatment, high concentration impurity regions ($p^+$ regions) 419p and 420p having the p-type conductivity are formed in the semiconductor layer 408p for forming the p-channel TFT. At the same time the high concentration impurity regions 419p and 420p are formed, the opening region of the resist pattern 414 which is placed apart from the channel region 411n in the semiconductor layer 408n of the n-channel TFT is used as a mask to form high concentration impurity regions ($p^+$ regions) 417n and 418n having the p-type conductivity. Conditions for doping of the n-type impurity and p-type impurity are the same as the doping conditions in Embodiment Mode 2. (See FIG. 5F)

Figure 4A:
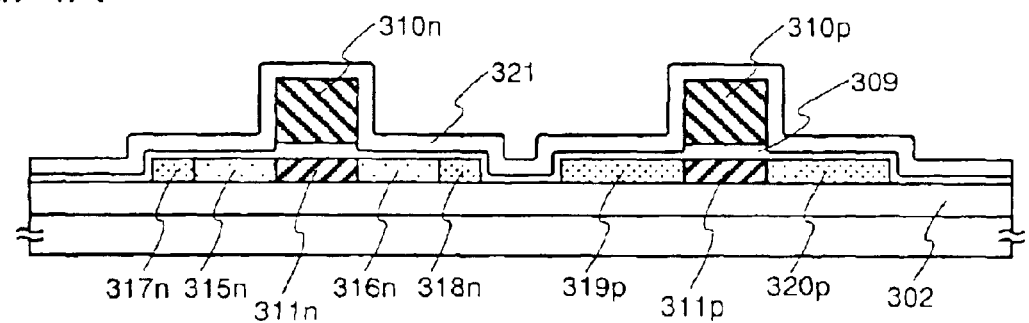
FIGS. 4A to 4C are sectional views showing subsequent steps to the process of FIGS. 3A to 3F for manufacturing a semiconductor device that has an n-channel TFT and a p-channel TFT both.
Figure 4B:
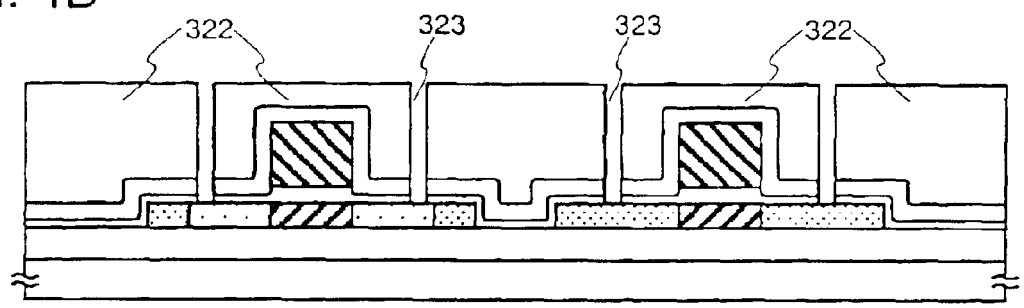
Figure 4C:
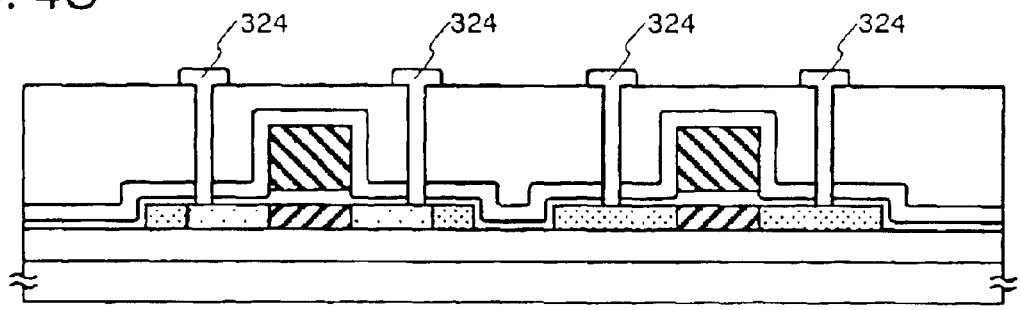
Figure 5A:
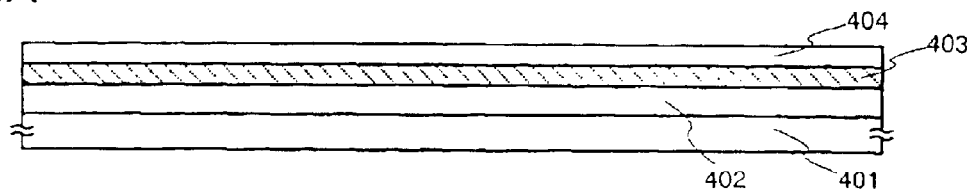
FIGS. 5A to 5F are sectional views showing a process (lateral growth method) of manufacturing a semiconductor device that has an n-channel TFT and a p-channel TFT both.
Figure 5B:
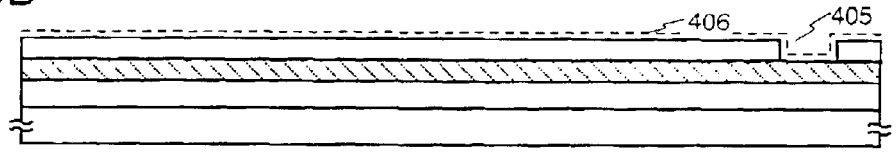
Figure 5C:
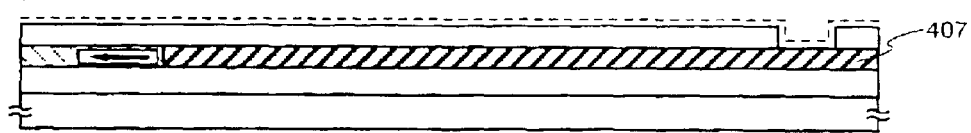
Figure 5D:
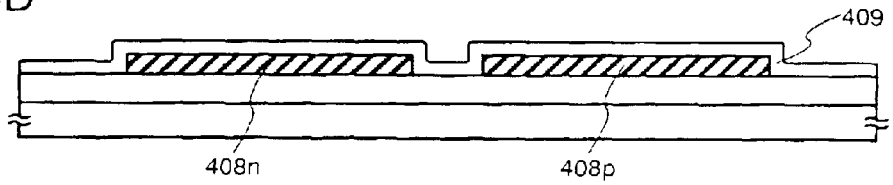
Figure 5E:
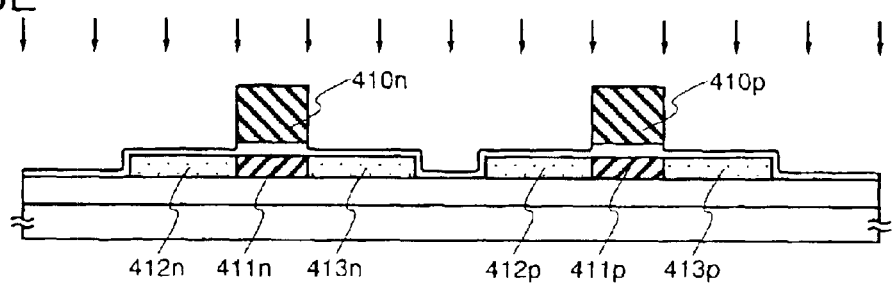
Figure 5F:
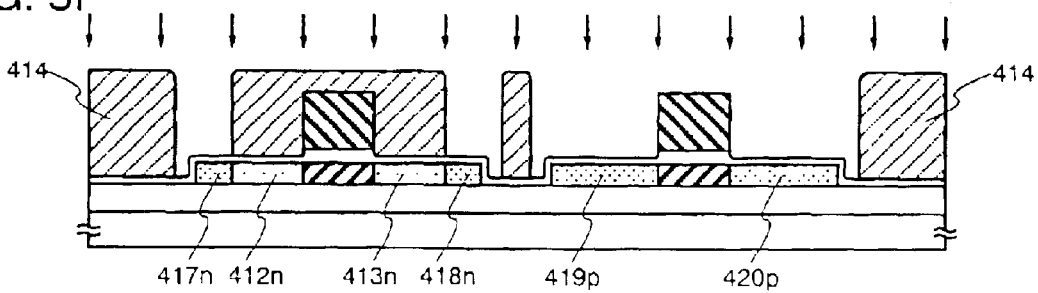
Figure 6A:
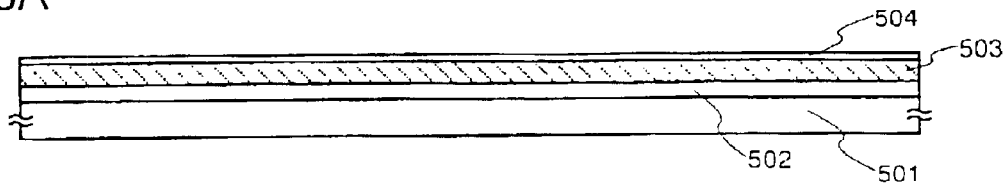
FIGS. 6A to 6F are sectional views showing a process (longitudinal growth method) of manufacturing a semiconductor device from crystal growth to formation of a gettering subject region.
Figure 6B:
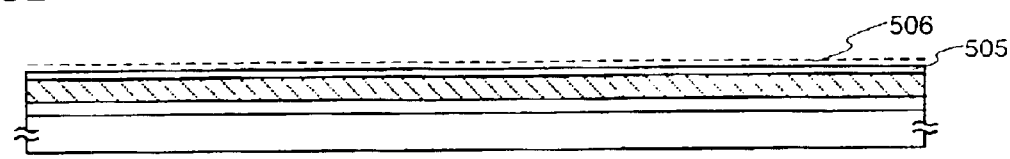
Figure 6C:
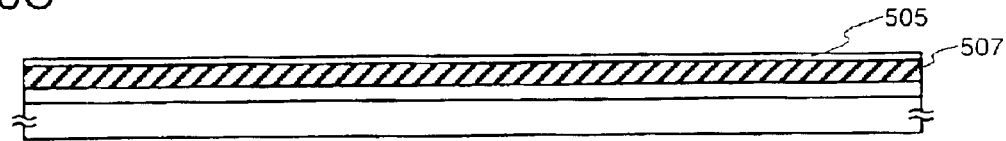
Figure 6D:
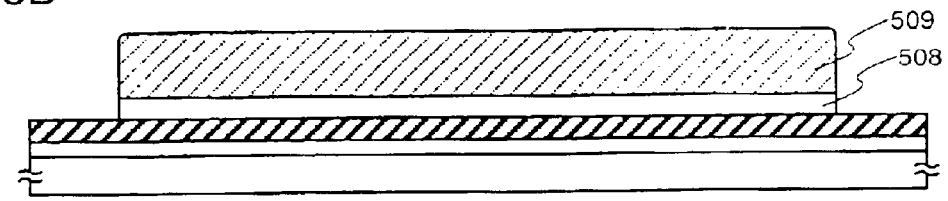
Figure 6E:
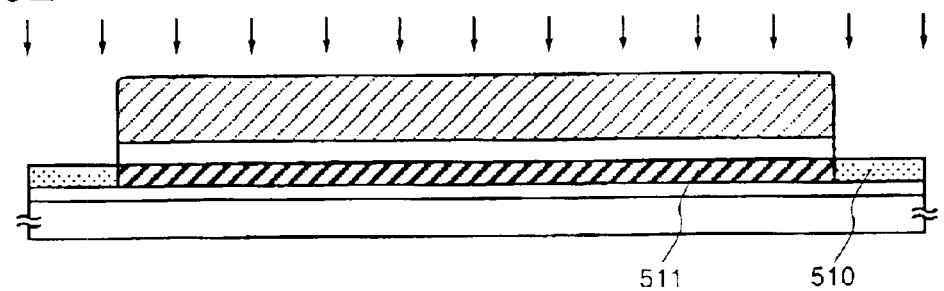
Figure 6F:
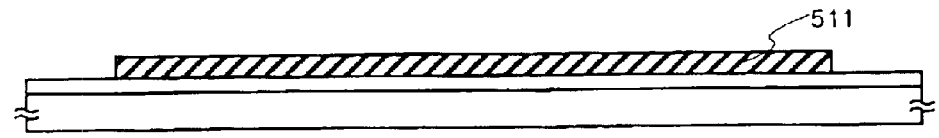

Interlayer insulating films, contact holes, and metal wiring lines are then formed by the same process illustrated in FIGS. 4A to 4C to complete a semiconductor device having an n-channel TFT and a p-channel TFT both.

As described above, highly efficient gettering regions where an n-type impurity (P) and a p-type impurity (B) are both present, namely, the high concentration impurity regions ($p^+$ regions) 417n and 418n having the p-type conductivity can be formed apart from the channel region 411n of the n-channel TFT in the semiconductor layer 408n also when the amorphous silicon film is crystallized by a lateral growth method. When a lateral growth method is used to crystallize the amorphous silicon film, the semiconductor layers 408n and 408p contain a catalytic element in a lower concentration than when a longitudinal growth method is used. Accordingly, the use of lateral growth method in crystallizing the amorphous silicon film provides an effect of lowering the gettering treatment temperature, shortening the gettering treatment time, and the like, which increases process margin Specific embodiments of the present invention will be described in detail below with reference to FIGS. 6A to 15D.

[Embodiment 1]

In Embodiment Modes 2 and 3, a region where an n-type impurity and a p-type impurity are both present is formed in at least a part of source region and drain region of a TFT and a catalytic element in a channel region alone is removed by the highly efficient gettering action of this region. These methods of manufacturing a semiconductor device are characterized by shortened process achieved by integrating a step of introducing a gettering source for forming a gettering region and an impurity doping step for forming a source region and a drain region into a single step. On the other hand, these methods can form only a gettering region of limited area and have room for improvement in terms of gettering efficiency. This embodiment describes a method of manufacturing a semiconductor device which can eliminate this drawback.

Figure 7A:
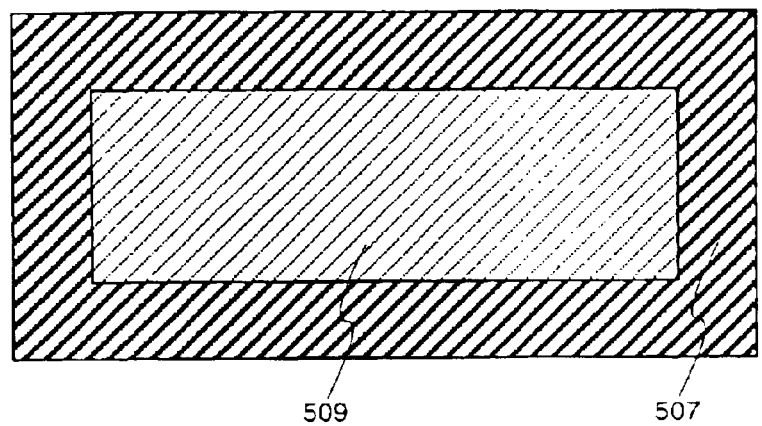
FIGS. 7A to 7C are plan views showing the semiconductor device manufacture process (longitudinal growth method) of FIGS. 6A to 6F.
Figure 7B:
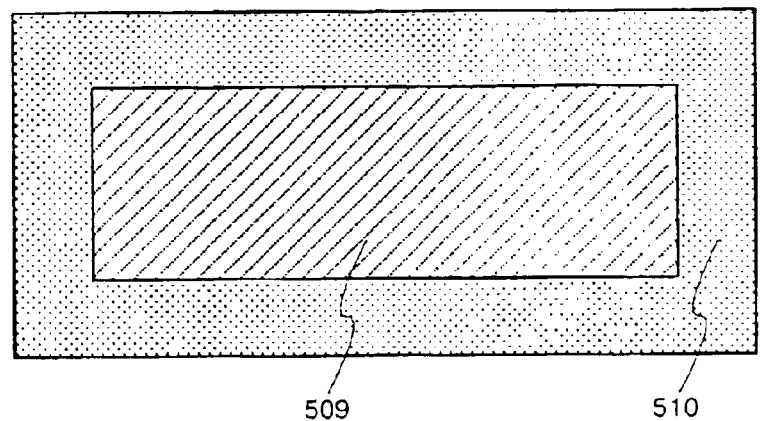
Figure 7C:
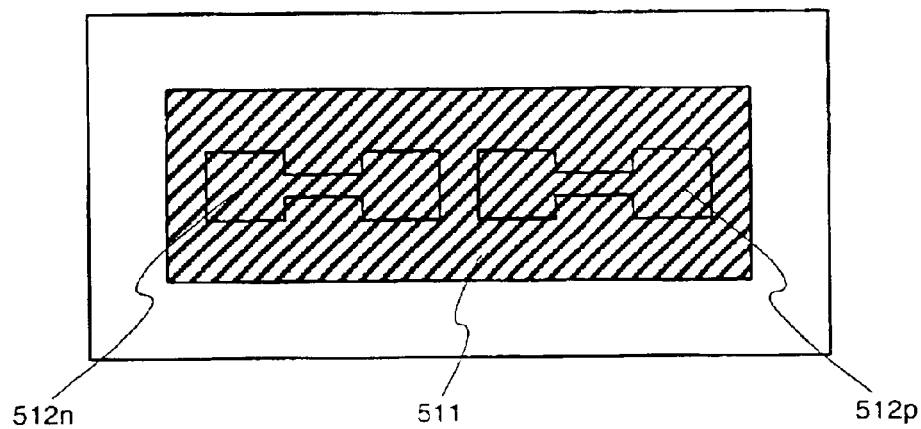
Figure 11A:
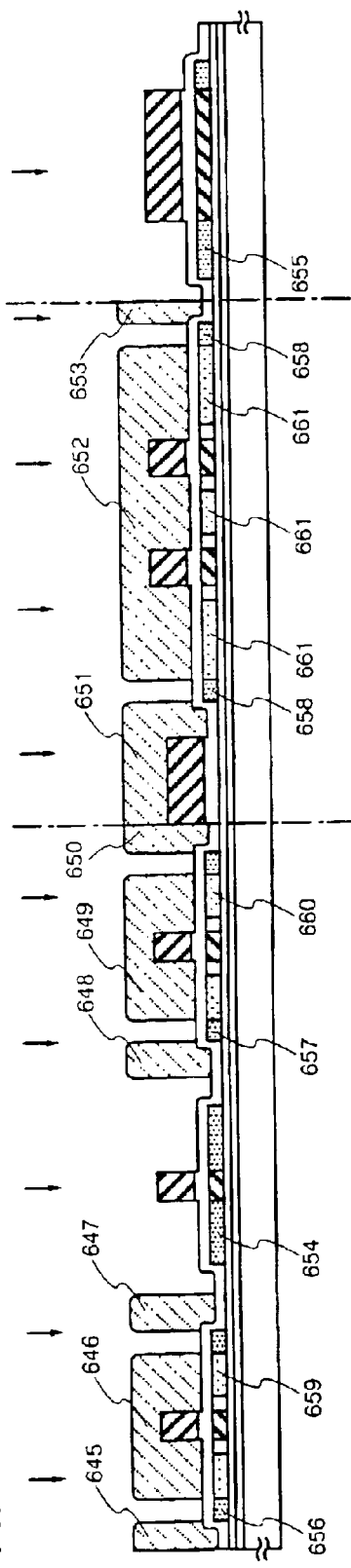
FIGS. 11A and 11B are sectional views showing a process of manufacturing an active matrix liquid crystal display device.
Figure 11B:
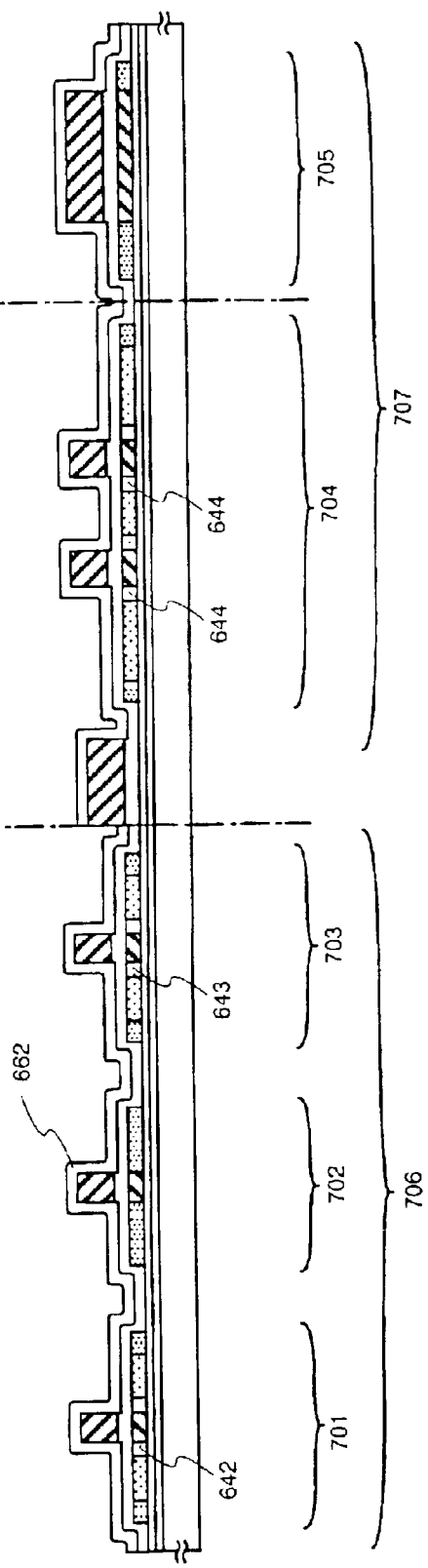

Specifically, according to the method of this embodiment, a region including a semiconductor layer that is composed of a channel region, a source region, and a drain region of a TFT is the gettering subject region, and highly efficient gettering regions containing an n-type impurity and a p-type impurity both are formed in the periphery of the gettering subject region to getter a catalytic element in the gettering subject region. Through the gettering treatment, the catalytic element in the gettering subject region can be reduced in advance. The method of this embodiment will be described in detail below with reference to FIGS. 6A to 7C. FIGS. 6A to 6F are sectional views showing the manufacturing process and FIGS. 7A to 7C are plan views of FIGS. 6D to 6F.

First, a silicon oxynitride film with a thickness of 100 nm is formed as a base film 502 on a glass substrate 501 by plasma CVD. Then, an amorphous silicon film 503 is immediately formed to have a thickness of 15 to 70 nm, preferably 30 to 60 nm. Plasma CVD is used in this embodiment to form the amorphous silicon film 503 to have a thickness of 50 nm, but low pressure CVD may be used instead. During formation of the amorphous silicon film 503, a natural oxide film 504 is formed on the surface by the effect of oxygen in the air. (See FIG. 6A)

The amorphous silicon film 503 is crystallized next. Before crystallization, the contaminated natural oxide film 504 on the surface of the amorphous silicon film 503 is removed by treating the substrate on which the amorphous silicon film 503 is formed with diluted fluoric acid. Then, the substrate receives ozone water treatment by the spin processing method (single wafer method) for a given period of time to form a very thin silicon oxide film 505 on the surface of the amorphous silicon film 503. The very thin silicon oxide film 505 has a function of improving the permeability of a Ni aqueous solution that is a catalytic element solution to be applied later by spin coating. Thereafter, a nickel acetate aqueous solution containing 10 ppm (by weight) of Ni that is a catalytic element is applied by spin coating. Thus formed on the entire surface of the amorphous silicon film 503 (the surface of the silicon oxide film 505, to be exact) is a very thin nickel-containing layer 506. (See FIG. 6B)

Next, the amorphous silicon film 503 is subjected to heat treatment in a nitrogen atmosphere at 550° C. for four hours to crystallize the film 503 and form a crystalline silicon film 507. The obtained crystalline silicon film 507 is irradiated with a laser to improve the crystallinity. The crystallinity of the crystalline silicon film 507 is greatly improved by the laser irradiation. This embodiment employs a pulse oscillation type KrF excimer laser (wavelength: 248 nm). The excimer laser not only improves the crystallinity of the crystalline silicon film 507 but also makes it very easy for Ni to move. Therefore, the laser irradiation also has an effect of improving the efficiency in gettering by a gettering source. (See FIG. 6C)

After the laser irradiation step, the substrate is washed with diluted fluoric acid to remove the very thin silicon oxide film 505 and very thin nickel-containing layer 506 on the surface of the crystalline silicon film 507. A mask insulating film 508 with a thickness of 30 to 200 nm is then formed. The mask insulating film 508 in this embodiment is a silicon oxide film formed by plasma CVD to have a thickness of 50 nm. After a resist pattern 509 is formed, a part of the mask insulating film 508 that is not covered with the resist pattern 509 is etched away by dry etching treatment. (See FIGS. 6D and 7A)

Next, the crystalline silicon film 507 is doped with P and B that are gettering sources while using the resist pattern 509 as a mask. Phosphorus (P) doping conditions include setting the acceleration voltage to 5 to 30 kV and the dose to $1.7 \times 10^{15}$ ions/cm$^2$. Boron (B) doping conditions include setting the acceleration voltage to 5 to 30 kV and the dose to $1.7 \times 10^{15}$ ions/cm$^2$ or more. In this embodiment, the film is first doped with P and then with B. Specific doping conditions in this embodiment includes setting the acceleration voltage to 10 kV and the dose to $1.7 \times 10^{15}$ ions/cm$^2$ for P doping and setting the acceleration voltage to 10 kV and the dose to $2.5 \times 10^{15}$ ions/cm$^2$ for B doping. (See FIGS. 6E and 7B)

Through the above doping treatment using the gettering sources (P and B), a region that is not covered with the resist pattern 509 is turned into a highly efficient gettering region 510 containing high concentrations of P and B. The gettering region 510 is made amorphous by the ion bombardment during doping. On the other hand, the region that is covered with the resist pattern 509 is a gettering subject region 511 to which the gettering sources are not introduced. (See FIGS. 6E and 7B)

The resist pattern 509 is removed using a dedicated releasing agent. Then, the substrate is subjected to heat treatment for gettering in an electric furnace to move Ni remaining in the gettering subject region 511 to the gettering region 510 through thermal diffusion. In this embodiment, heat treatment is conducted in a nitrogen atmosphere at 550° C. for four hours as gettering treatment. Thereafter, the mask insulating film 508 having the same shape as the resist pattern 509 and remaining after the resist pattern 509 is removed is used as a mask to etch the crystalline silicon film in the gettering region 510 by dry etching. The mask insulating film 508 used as the mask for the dry etching is then removed using diluted fluoric acid. In this way, gettering treatment is performed on the gettering subject region 511 that includes a semiconductor layer 512 of an n-channel TFT and a semiconductor layer 513 of a p-channel TFT both. (See FIGS. 6F and 7C)

In the heat treatment for gettering, movement of Ni in the gettering subject region 511 through thermal diffusion is further facilitated because the laser irradiation has already made it easy for Ni to move and the gettering region S to has been made amorphous by ion bombardment. (See FIGS. 6F and 7C)

Through the above manufacturing steps, the Ni concentration is reduced in the gettering subject region 511, namely, the region including both the semiconductor layer 512n for forming the n-channel TFT and the semiconductor layer 512p for forming the p-channel TFT. The subsequent steps follow the manufacturing steps illustrated in FIGS. 3D to 3F and FIGS. 4A to 4C in Embodiment Mode 2 to complete a semiconductor device having an n-channel TFT and a p-channel TFT both.

In the example shown in this embodiment, Ni in the region including the semiconductor layers 512n and 512p of the TFTs is gettered before the manufacturing steps in Embodiment Mode 2 for completing a semiconductor device that has an n-channel TFT and a p-channel TFT both. This gettering step and the source/drain gettering of Embodiment Mode 2 add up to two gettering steps in the manufacturing method of this embodiment. Accordingly, this method can reduce the Ni concentration in a channel region of a TFT even more. The gettering subject region 511 in this embodiment include the semiconductor layer 512n for forming the n-channel TFT and the semiconductor layer 512p for forming the p-channel TFT both, but only one of the n-channel TFT and p-channel TFT may be included in the gettering subject region.

Although the number of steps is increased, the manufacturing method of this embodiment can reduce the Ni concentration in a channel region of a TFT even more and therefore is capable of further improving the electric characteristics (such as field effect mobility and OFF current) and reliability (leak current) of the n-channel TFT. With the more improved gettering efficiency, the gettering treatment temperature is reduced and gettering treatment time is shortened. Therefore, the method is also effective in enhancing the process margin for gettering treatment.

[Embodiment 2]

Embodiment 2 shows an example of applying the semiconductor device manufacturing process of Embodiment Mode 2 to actual manufacture of an active matrix liquid crystal display device. A detailed description will be given below with reference to FIGS. 8A to 12B.

A first layer silicon oxynitride film 602a with a thickness of 50 nm and a second layer silicon oxynitride film 602b with a thickness of 100 nm are formed as a base film 602 on a glass substrate 601 by plasma CVD. The first layer and second layer of the base film have different composition ratios. The glass substrate 601 used here is formed from silica glass, barium borosilicate glass, aluminoborosilicate glass, or the like. An amorphous silicon film 603a is formed on the base film 602 (602a and 602b) by plasma CVD to have a thickness of 50 nm. This embodiment uses plasma CVD to form the amorphous silicon film 603a but low pressure CVD may be used instead. There is a possibility of carbon, oxygen, or nitrogen in the air mixing in during formation of the amorphous silicon film 603a. It is an experiential knowledge that such impurity gas mixed in causes degradation in characteristics of the resultant TFT. Therefore, it is recognized that impurity gas mixed in acts as a crystallization inhibition factor. Contamination by impurity gas has to be avoided as much as possible and the acceptable impurity concentration is specifically $5\times10^{17}$ atoms/cm$^3$ or lower for carbon and nitrogen and $1\times10^{18}$ atoms/cm$^3$ or lower for oxygen. (See FIG. 8A)

The next step is pre-treatment for crystallization of the amorphous silicon film 603a. When the substrate is retrieved from a low pressure CVD apparatus, a natural oxide film (not shown) is usually formed on the surface of the amorphous silicon film 603a to contaminate the substrate. The natural oxide film (not shown) is removed by washing the contaminated surface of the amorphous silicon film 603a with diluted fluoric acid. The surface of the amorphous silicon film 603a is further treated with ozone water to oxidize the surface of the amorphous silicon film 603a and form a clean, very thin silicon oxide film (not shown) to have a thickness of 0.5 to 5 nm. The very thin silicon oxide film has an effect of improving the permeability of a Ni aqueous solution to the amorphous silicon film 603a in a later spin coating step to make the film adsorb Ni uniformly. (See FIG. 8A)

A Ni aqueous solution that is a catalytic element solution is applied next by spin coating. In this embodiment, the catalytic element solution is a nickel acetate aqueous solution containing 10 ppm (by weight) of Ni and applied by spin coating. (See FIG. 8A)

In order to control the hydrogen content in the amorphous silicon film 603a so that the film contains 5 atomic % or less hydrogen, the substrate is subjected to heat treatment in an electric furnace in a nitrogen atmosphere at 450° C. for an hour. The amorphous silicon film 603a is thus dehydrogenated. After the dehydrogenation treatment, the substrate is immediately subjected to another heat treatment at 550° C. for four hours to crystallize the amorphous silicon film 603a and form a crystalline silicon film 603b. The obtained crystalline silicon film 603b is irradiated with a laser to improve the crystallinity. The laser irradiation greatly improves the crystallinity of the crystalline silicon film 603b. This embodiment employs a pulse oscillation type KrF excimer laser (wavelength: 248 nm). The excimer laser not only improves the crystallinity of the crystalline silicon film 603b but also makes it very easy for Ni to move. Therefore, the laser irradiation also has an effect of improving the efficiency in gettering by a gettering source. (See FIG. 8B)

Next, the crystalline silicon film 603b is patterned by normal photolithography treatment and dry etching treatment into semiconductor layers 604 to 608 that are to serve as channel regions, source regions, and drain regions of TFTs. Formation of the semiconductor layers 604 to 608 may be followed by channel doping that is impurity element (boron or phosphorus) doping treatment to control Vth of the TFTs. (See FIG. 9A)

A silicon oxynitride film with a thickness of 100 nm is formed as a gate insulating film 609 by plasma CVD so as to cover the semiconductor layers 604 to 608. Before forming the gate insulating film 609, the contaminated surfaces of the semiconductor layers 604 to 608 where natural oxide films (not shown) are formed are treated with diluted fluoric acid to remove the natural oxide films. A conductive film as a gate electrode material is formed on the gate insulating film 609 by sputtering or CVD. The gate electrode material used here is preferably a heat resistant material that can withstand the temperature (550 to 650° C.) of later heat treatment for gettering as well as for activation of impurity elements. Examples of the heat resistant material include high melting point metals such as Ta (tantalum), Mo (molybdenum), Ti (titanium), W (tungsten), and Cr (chromium), metal suicides that are compounds of high melting point metals and silicon, and polycrystalline silicon having the n-type or p-type conductivity. This embodiment employs a W film formed by sputtering to have a thickness of 400 nm for a gate electrode film 610. (See FIG. 9B)

Photolithography treatment and dry etching treatment for forming gate electrodes are performed on the substrate structured as above. Thus formed are gate electrodes 617 to 620, a storage capacitor electrode 621, and an electrode 622 that functions as a source wiring line. After the dry etching, resist patterns 611 to 614 used as masks during the dry etching are left on the gate electrodes 617 to 620. Also left after the dry etching are a resist pattern 615 on the storage capacitor electrode 621 and a resist pattern 616 on the gate electrode 622 that functions as a source wiring line. The underlying gate insulating film 609 formed from a silicon oxynitride film is thinned by the dry etching to be shaped into a gate insulating film 623. (See FIG. 10A)

Leaving the resist patterns 611 to 616 in their places, the gate electrodes 617 to 620 and the storage capacitor electrode 621 are used as masks for n-type impurity low concentration doping that is the first doping treatment by a doping device. The first doping treatment employs P as an n-type impurity element and the doping conditions thereof include setting the acceleration voltage to 60 to 100 kV and the dose to $3\times10^{12}$ to $3\times10^{13}$ ions/cm$^2$. Through the first doping treatment, low concentration n-type impurity regions (n$^-$ regions) 629 to 633 are formed in the semiconductor layers 604 to 608 on the outside of the gate electrodes 617 to 620 and storage capacitor electrode 621. At the same time, substantially intrinsic regions 624 to 627 functioning as channel regions of the TFTs are formed just below the gate electrodes 617 to 620. The semiconductor layer 608 is not a region for forming a TFT but a region for forming a storage capacitor 705. Therefore, an intrinsic region 628 functioning as one of capacitor forming electrodes is formed in the semiconductor layer 608 just below the storage capacitor electrode 621: (See FIG. 10A)

The substrate is then washed using a dedicated releasing agent to remove the resist patterns 611 to 616 that have been used as masks for the dry etching. After the removal, resist patterns 634 to 636 for forming n$^+$ regions which are to serve as masks during the second doping treatment are formed so as to cover the gate electrodes 617, 619, and 620 in n-channel TFTs 701 and 703 of a driving circuit 706 and in a pixel TFT 704 of a pixel region 707. The second doping treatment is for giving the TFTs 701, 703, and 704 an LDD structure. N-type impurity high concentration doping is conducted as the second doping treatment. P is employed as an n-type impurity and the doping conditions include setting the acceleration voltage to 60 to 100 kV and the dose to $1.7\times10^{15}$ ions/cm$^2$. Through the second doping treatment, high concentration n-type impurity regions (n$^+$ regions) 637, 639, and 640 are formed in the semiconductor layers 604, 606, and 607 that are on the outside of the resist patterns 634 to 636. With the formation of the high concentration n-type impurity regions (n$^+$ regions) 637, 639, and 640, the low concentration impurity regions (n⁻ regions) 629, 631, and 632 previously formed are divided into the high concentration impurity regions (n⁺ regions) 637, 639, and 640 and low concentration impurity regions (n⁻ regions) 642 to 644. Thus formed are source regions and drain regions having an LDD structure. (See FIG. 10B)

A p-channel TFT 702 of the driving circuit 706 and the storage capacitor 705 of the pixel region 707, which are not the LDD structure forming regions, are doped while the gate electrode 618 and the storage capacitor electrode 621 are used as masks for 702 and 705, respectively. As a result, a high concentration n-type impurity region (n⁺ region) 638 is formed in the semiconductor layer 605 that is on the outside of the gate electrode 618 and a high concentration n-type impurity region (n⁺ region) 641 is formed in the semiconductor layer 608 that is on the outside of the storage capacitor electrode 621. (See FIG. 10B)

Formed next by normal photolithography treatment are resist patterns 645 to 653 that set the semiconductor layer 605 for forming the p-channel TFT 702 and the semiconductor layer 608 for forming the storage capacitor 705 as opening regions, and place opening regions in ends apart from the channel region 624, 626, and 627 in the semiconductor layers 604, 606, and 607 for forming the n-channel TFTs 701 and 703 and the pixel TFT 704. Then, the resist patterns 645 to 653 are used as masks for p-type impurity high concentration doping as the third doping treatment by a doping device. Through the third doping treatment, the semiconductor layer 605 for forming the p-channel TFT 702 is doped with B that is a p-type impurity while using as a mask the gate electrode 618. As a result, a high concentration impurity region (p⁺ region) 654 having the p-type conductivity is formed in the semiconductor layer 605 on the outside of the gate electrode 618. The high concentration impurity region (p⁺ region) 654 has already been doped with P that is an n-type impurity. However, the high concentration impurity region (p⁺ region) 654 is doped in the third doping treatment with high concentration of B, at a dose of $2.5 \times 10^{15}$ ions/cm², to have the p-type conductivity and function as a source region and drain region. In the region for forming the storage capacitor 705, a high concentration impurity region (p⁺ region) 655 having the p-type conductivity is similarly formed in the semiconductor layer 608 on the outside of the storage capacitor electrode 621. (See FIG. 11A)

The high concentration impurity regions (p⁺ regions) 654 and 655 contain both P and B and also function as highly efficient gettering regions for gettering Ni in the intrinsic region 625 that functions as the channel region of the p-channel TFT 702 and in the intrinsic region 628 that functions as one of the capacitor forming electrodes. (See FIG. 11A)

At the same time the high concentration impurity regions (p⁺ regions) 654 and 655 having the p-type conductivity are formed, high concentration impurity regions (p⁺ regions) 656 to 658 having the p-type conductivity are formed apart from the channel region 624, 626, and 627 in the semiconductor layers 604, 606, and 607 for forming the n-channel TFTs 701 and 703 and the pixel TFT 704. The high concentration impurity regions (p⁺ regions) 656 to 658 also contain both P and B and therefore function as highly efficient gettering regions for gettering Ni in the substantially intrinsic regions 624, 626 and 627 that function as the channel regions. With the formation of the high concentration impurity regions (p⁺ regions) 656 to 658, the high concentration n-type impurity regions (n⁺ regions) 637, 639, and 640 previously formed are divided into the high concentration impurity regions (p⁺ regions) 656 to 658 having the p-type conductivity and high concentration impurity regions (n⁺ regions) 659 to 661 having the n-type conductivity. (See FIG. 11A)

After the resist patterns 645 to 653 are removed, a silicon oxynitride film with a thickness of 150 nm is formed as a first interlayer insulating film 662 by plasma CVD. Then, heat treatment is conducted in an electric furnace at 550° C. for four hours to activate thermally the impurity elements (P and B) implanted in the semiconductor layers 604 to 608. This heat treatment for thermal activation of the impurity elements doubles as gettering treatment. Through the heat treatment, Ni contained in the substantially intrinsic regions 624 to 627 that function as the channel regions and in the intrinsic region 628 that functions as one of the capacitor forming electrodes is gettered by the above-described highly efficient gettering regions containing both P and B in the semiconductor layers 604 to 608. The thermal activation treatment may precede formation of the first interlayer insulating film 662. However, if the gate electrode or other wiring line material has a low heat resistance, it is preferable to form the first interlayer insulating film 662 before the activation. Thereafter, the semiconductor layers 604 to 608 are subjected to hydrogenation treatment in a nitrogen atmosphere containing 3% of hydrogen at 410° C. for an hour to terminate dangling bonds in the semiconductor layers. (See FIG. 1B)

Next, an acrylic resin film with a thickness of 1.6 μm is formed as a second interlayer insulating film 663 on the first interlayer insulating film 662. Then, contact holes are formed by normal photolithography treatment and dry etching treatment so as to pierce the second interlayer insulating film 663 and the first interlayer insulating film 662 as well as the gate insulating film 623 below the first interlayer insulating film 662. The contact holes are connected to the gate electrode 622 functioning as a source wiring line and to the high concentration impurity regions 659 to 661 and 654 and 655. (See FIG. 12A)

Conductive metal wiring lines 664 to 669 are formed next to be electrically connected to the high concentration impurity regions 654, 659, and 660 of the driving circuit 706. The same conductive material is used to form connection electrodes 670, 672, and 673 and gate wiring line 671 of the pixel region 707. This embodiment employs a laminate of a Ti film with a thickness of 50 nm and an Al—Ti alloy film with a thickness of 500 nm as a material to form the metal wiring lines 664 to 669, the connection electrodes 670, 672, and 673, and the gate wiring line 671. The connection electrode 670 is formed such that it electrically connects the electrode 622 functioning as a source wiring line with the pixel TFT 704 through the impurity region 661. The connection electrode 672 is electrically connected to the impurity region 661 of the pixel TFT 704. The connection electrode 673 is electrically connected to the impurity region 655 of the storage capacitor 705. The gate wiring line 671 electrically connects the plural gate electrodes 620 of the pixel TFT 704 to one another. A transparent conductive film such as an ITO (indium tin oxide) film is formed to have a thickness of 80 to 120 nm and receives photolithography treatment and etching treatment to form a pixel electrode 674. The pixel electrode 674 is electrically connected through the connection electrode 672 to the impurity region 661 that serves as the source region and drain region of the pixel TFT 704. The pixel electrode 674 is also electrically connected through the connection electrode 673 to the impurity region 655 of the storage capacitor 705. (See FIG. 12B)

An active matrix liquid crystal display device in which an n-channel TFT has an LDD structure and a p-channel TFT has a single drain structure can be manufactured by the above manufacturing process. In the n-channel TFT having the LDD structure of this active matrix liquid crystal display device, a highly efficient gettering region containing an n-type impurity (P) and a p-type impurity (B) both is formed in a semiconductor layer apart from a channel region of the semiconductor layer, which characterizes the present invention. An active matrix liquid crystal display device manufactured by this method can have improved efficiency in gettering a catalytic element of a channel region not only in a p-channel TFT but also in an n-channel TFT through simple process. Therefore, the present invention is effective in improving electric characteristics such as field effect mobility and OFF current of an n-channel TFT and p-channel TFT.

[Embodiment 3]

The present invention relates to a semiconductor device such as a TFT that uses a crystalline semiconductor film containing silicon, as well as a method of manufacturing the same, and is applicable to various active matrix liquid crystal display devices and manufacture thereof. Therefore, the present invention can be applied to electronic equipment in general in various fields which has an active matrix liquid crystal display device as its display medium. Specific examples of the electronic equipment are described here with reference to FIGS. 14A to 16C. The electronic equipment are a video camera, a digital camera, a projector (rear projector or front projector), a head mounted display (goggle type display), a game machine, a navigation system for vehicles, a personal computer, a portable information terminal (such as a mobile computer, a portable telephone, and an electronic book), etc.

Figure 14A:
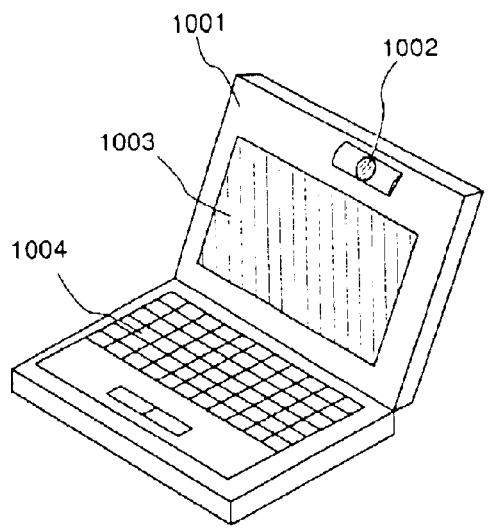
FIGS. 14A to 14F are schematic diagrams of devices showing examples of electronic equipment with a liquid crystal display device incorporated therein.

FIG. 14A shows a personal computer, which is composed of a main body 1001, an image input unit 1002, a display device 1003, and a keyboard 1004. The present invention is applicable to the display device 1003 and other circuits.

Figure 14B:
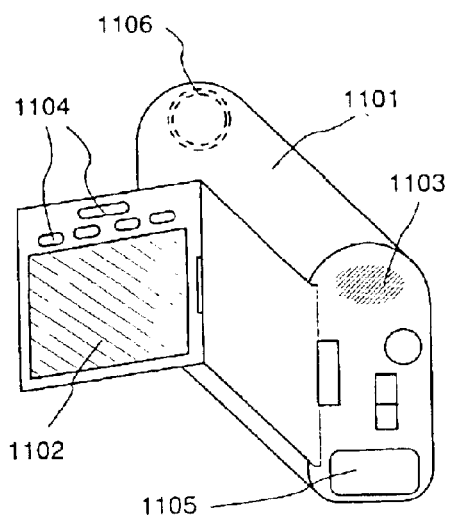

FIG. 14B shows a video camera, which is composed of a main body 1101, a display device 1102, an audio input unit 1103, operation switches 1104, a battery 1105, and an image receiving unit 1106. The present invention is applicable to the display device 1102 and other circuits.

Figure 14C:
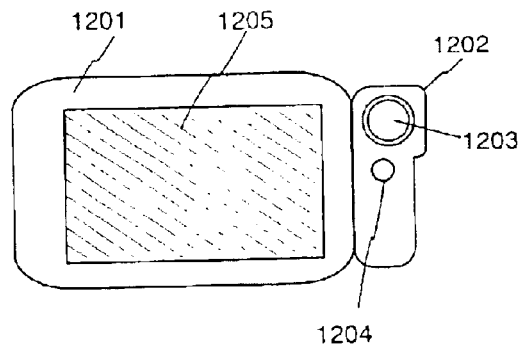

FIG. 14C shows a mobile computer, which is composed of a main body 1201, a camera unit 1202, an image receiving unit 1203, operation switches 1204, and a display device 1205. The present invention is applicable to the display device 1205 and other circuits.

Figure 14D:
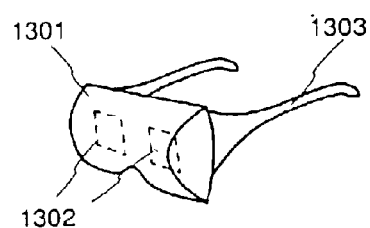

FIG. 14D shows a goggle type display, which is composed of a main body 1301, display devices 1302, and an arm unit 1303. The present invention is applicable to the display devices 1302 and other circuits.

Figure 14E:
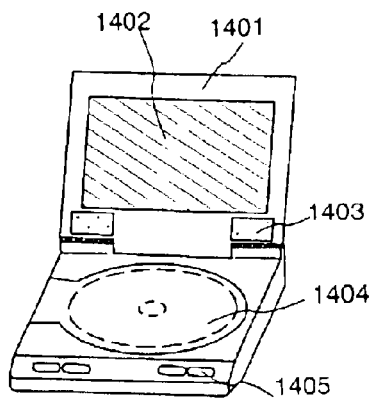

FIG. 14E shows a player using a recording medium in which a program is recorded (hereinafter abbreviated as recording medium). The player is composed of a main body 1401, a display device 1402, a speaker unit 1403, a recording medium 1404, and operation switches 1405. This device uses as the recording medium DVD, CD, and the like for listening to music, playing video games, and surfing the Internet. The present invention is applicable to the display device 1402 and other circuits.

Figure 14F:
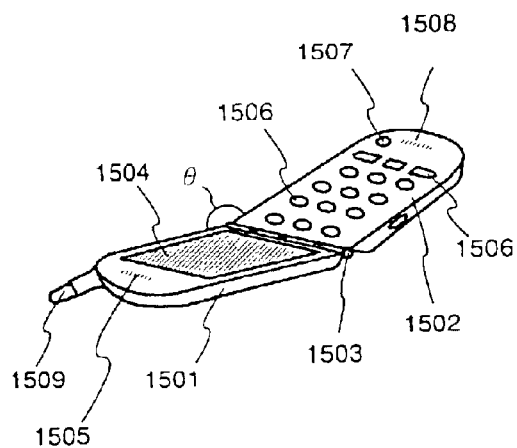

FIG. 14F shows a portable telephone, which is composed of a display panel 1501, an operation panel 1502, a connecter unit 1503, a display unit 1504, an audio output unit 1505, operation keys 1506, a power switch 1507, an audio input unit 1508, and an antenna 1509. The display panel 1501 is connected to the operation panel 1502 by the connector unit 1503. An angle θ formed between the plane on which the display unit 1504 of the display panel 1501 is set and the plane on which the operation keys 1506 of the operation panel 1502 are set can be changed arbitrarily at the connector unit 1503. The present invention is applicable to the display unit 1504. (See FIGS. 14A to 14F)

FIG. 15A shows a front projector, which is composed of a light source optical system and display device 1601 and a screen 1602. The present invention is applicable to the display device 1601 and other circuits.

FIG. 15B shows a rear projector, which is composed of a main body 1701, a light source optical system and display device 1702, mirrors 1703 and 1704, and a screen 1705. The present invention is applicable to the display device 1702 and other circuits.

FIG. 15C is a diagram showing an example of the structure of the light source optical system and display device 1601 in FIG. 15A or the light source optical system and display device 1702 in FIG. 15B. The light source optical system and display device 1601 or 1702 is composed of a light source optical system 1801, mirrors 1802 and 1804 to 1806, dichroic mirrors 1803, an optical system 1807, display devices 1808, phase difference plates 1809, and a projection optical system 1810. The projection optical system 1810 is comprised of a plurality of optical lenses provided with a projection lens. This structure is called a three-plate type since it employs three display devices 1808. In the light path indicated by the arrow in FIG. 15C, an optical lens and a film having polarizing function, a film for adjusting the phase difference, or an IR film may be provided at discretion.

FIG. 15D is a diagram showing an example of the structure of the light source optical system 1801 in FIG. 15C. In this embodiment, the light source optical system 1801 is composed of a reflector 1811, a light source 1812, lens arrays 1813 and 1814, a polarization converting element 1815, and a condenser 1816. The light source optical system shown FIG. 15D is merely an example and the present invention is not limited thereto. For example, the light source optical system may be provided with an optical lens and a film having polarizing function, a film for adjusting the phase difference, or an IR film at discretion. (See FIGS. 15A to 15D)

Figure 16A:
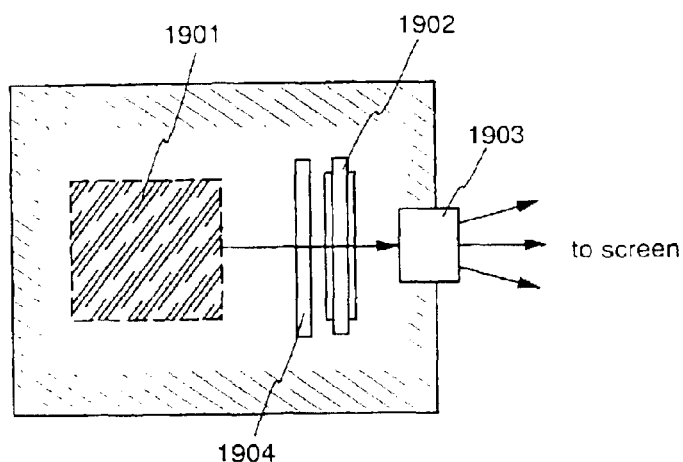
FIGS. 16A to 16C are schematic diagrams of devices showing examples of electronic equipment with a liquid crystal display device incorporated therein.

FIG. 16A shows an example of single plate type. A light source optical system and display device in FIG. 16A is composed of a light source optical system 1901, a display device 1902, a projection optical system 1903, and a phase difference plate 1904. The projection optical system 1903 is comprised of a plurality of optical lenses provided with a projection lens. The light source optical system and display device of FIG. 16A can be applied to the light source optical system and display devices 1601 and 1702 of FIGS. 15A and 15B. The light source optical system shown in FIG. 15D can be used for the light source optical system 1901. The display device 1902 has color filters (not shown) to display images in color.

Figure 16B:
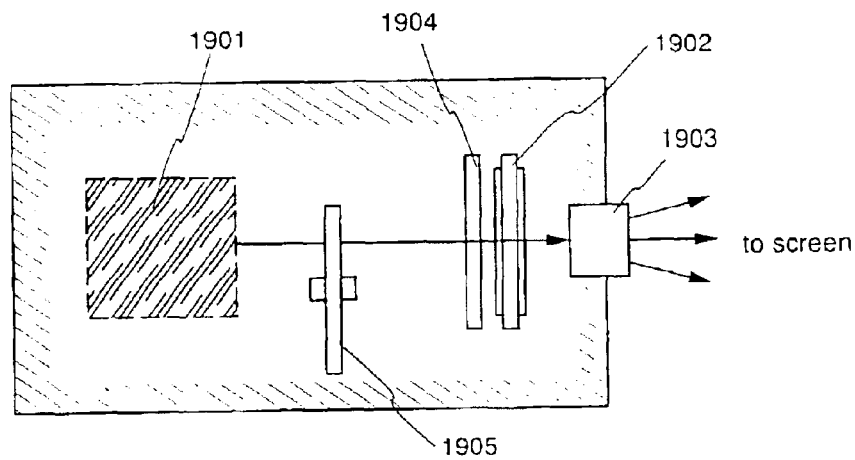

FIG. 16B shows an application example of the light source optical system and display device of FIG. 16A. In this example, a rotary RGB color filter disk 1905 is used instead of the color filters to display a color image. The light source optical system and display device of FIG. 16B can be applied to the light source optical system and display devices 1601 and 1702 of FIGS. 15A and 15B.

Figure 16C:
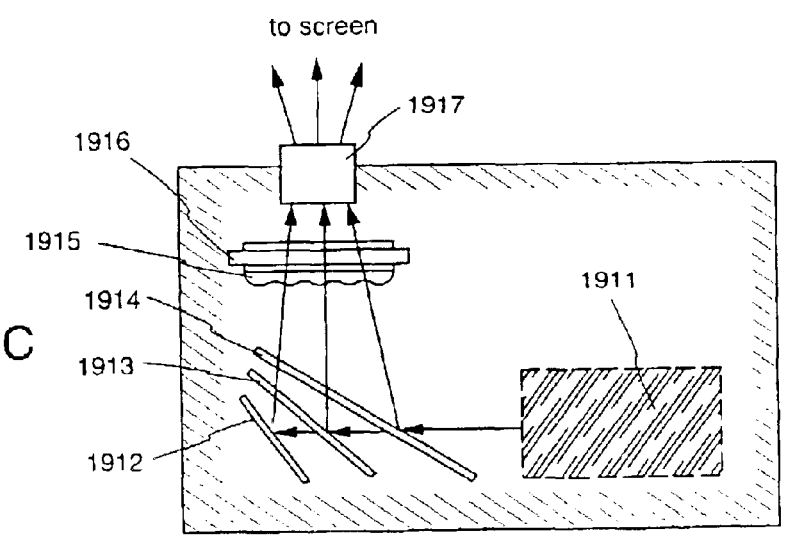

A light source optical system and display device shown in FIG. 16C is called a color filter less single plate type. This type displays a color image by providing a display device 1916 with a microlens array 1915 and using a dichroic mirror (green) 1912, a dichroic mirror (red) 1913, and a dichroic mirror (blue) 1914. A projection optical system 1917 is comprised of a plurality of optical lenses provided with a projection lens. The light source optical system and display device of FIG. 16C can be applied to the light source optical system and display devices 1601 and 1702 of FIGS. 15A and 15B. An optical system having a coupling lens and a collimator lens in addition to a light source can be used as the light source optical system 1911.

As described above, the application range of the semiconductor device of the present invention and its manufacturing method is very wide. The present invention is therefore applicable to electronic equipment of various fields which has an active matrix liquid crystal display device.

The present invention improves the efficiency in gettering a catalytic element in a channel region of an n-channel TFT (which is inferior to the gettering efficiency of a p-channel TFT), and has the following effects.

(Effect 1) The present invention can solve the problem of inferior catalytic element gettering efficiency in a channel region of an n-channel TFT to the gettering efficiency of a p-channel TFT and therefore is effective in improving electric characteristics and reliability of the n-channel TFT. (Effect 2) Improvement in catalytic element gettering efficiency in a channel region of an n-channel TFT is advantageous for lowering the gettering treatment temperature and shortening the gettering treatment time, and therefore the invention is effective in enhancing process margin of gettering treatment. (Effect 3) Improvement in catalytic element gettering efficiency in a channel region of an n-channel TFT is effective in improving the quality of a liquid crystal display device that is composed of a plurality of TFTs.

What is claimed is:

1. A semiconductor device comprising:

a crystalline semiconductor layer over a substrate, the crystalline semiconductor layer containing a catalytic element that accelerates a crystallization of a semiconductor film; and a gate electrode adjacent to the crystalline semiconductor layer with a gate insulating film interposed therebetween, wherein the crystalline semiconductor layer has at least a channel region, a first region comprising an n-type impurity element adjacent to the channel region, and a second region comprising a p-type impurity element adjacent to the first region.

wherein the second region comprises the catalytic element at a higher concentration than the first region, and wherein a metal wiring line is in contact with the first region.

2. A semiconductor device comprising:

a crystalline semiconductor layer over a substrate, the crystalline semiconductor layer containing a catalytic element that accelerates a crystallization of a semiconductor film;

a gate electrode adjacent to the crystalline semiconductor layer with a gate insulating film interposed therebetween;

an interlayer insulating film covering at least the gate electrode and the crystalline semiconductor layer; and a contact hole in the interlayer insulating film, wherein the crystalline semiconductor layer has at least a channel region, a first region comprising an n-type impurity element in contact with the channel region, and a second region comprising a p-type impurity element in contact with the first region, wherein a concentration of the p-type impurity element is 1 to 3 times higher than a concentration of the n-type impurity element, and wherein the contact hole is formed so as to reach the first region.

3. A semiconductor device comprising:

first and second crystalline semiconductor layers over a substrate, the first and second crystalline semiconductor layers containing a catalytic element that accelerates a crystallization of a semiconductor film;

first and second gate electrodes each adjacent to the first and the second crystalline semiconductor layers with a gate insulating film interposed therebetween, wherein the first crystalline semiconductor layer has at least a channel region, a first region comprising an n-type impurity element adjacent to the channel region, and a second region comprising a p-type impurity element adjacent to the first region, wherein a concentration of the p-type impurity element is 1 to 3 times higher than a concentration of the n-type impurity element, and wherein the second crystalline semiconductor layer has at least a channel region, a third region comprising an n-type impurity element and a p-type impurity element adjacent to the channel region.

4. A semiconductor device comprising:

first and second crystalline semiconductor layers over a substrate, the first and the second crystalline semiconductor layers containing a catalytic element that accelerates a crystallization of a semiconductor film;

first and second gate electrodes each adjacent to the first and the second crystalline semiconductor layers with a gate insulating film interposed therebetween;

an interlayer insulating film covering at least the first and second crystalline semiconductor layers and the first and second gate electrodes;

a contact hole in the interlayer insulating film;

wherein the first crystalline semiconductor layer has at least a channel region, a first region comprising an n-type impurity element adjacent to the channel region, and a second region comprising a p-type impurity element adjacent to the first region, wherein a concentration of the p-type impurity element is 1 to 3 times higher than a concentration of the n-type impurity element, wherein the second crystalline semiconductor layer has at least a channel region, a third region comprising an n-type impurity element and a p-type impurity element adjacent to the channel region, and wherein the contact hole is formed so as to reach the first region.

5. A semiconductor device comprising:

a crystalline semiconductor layer over a substrate, the crystalline semiconductor layer containing a catalytic element that accelerates a crystallization of a semiconductor film; and a gate electrode adjacent to the crystalline semiconductor layer with a gate insulating film interposed therebetween, wherein the crystalline semiconductor layer has at least a channel region, a first region comprising an n-type impurity element adjacent to the channel region, and a second region comprising a p-type impurity element adjacent to the first region, and wherein the second region contains the catalytic element at a higher concentration than the first region.

6. A semiconductor device comprising:

a crystalline semiconductor layer over a substrate, the crystalline semiconductor layer containing a catalytic element that accelerates a crystallization of a semiconductor film;

a gate electrode adjacent to the crystalline semiconductor layer with a gate insulating film interposed therebetween, an interlayer insulating film covering at least the gate electrode and the crystalline semiconductor layer; and a contact hole in the interlayer insulating film, wherein the crystalline semiconductor layer has at least a channel region, a first region comprising an n-type impurity element adjacent to the channel region, and a second region comprising a p-type impurity element adjacent to the first region, wherein the second region contains the catalytic element at a higher concentration than the first region, and wherein the contact hole is formed so as to reach the first region.

7. A semiconductor device comprising:

first and second crystalline semiconductor layers over a substrate, the first and second crystalline semiconductor layers containing a catalytic element that accelerates a crystallization of a semiconductor film;

first and second gate electrodes each adjacent to the first and second crystalline semiconductor layers with a gate insulating film interposed therebetween, wherein the first crystalline semiconductor layer has at least a channel region, a first region comprising an n-type impurity element adjacent to the channel region, and a second region comprising a p-type impurity element adjacent to the first region, and wherein the second region contains the catalytic element at a higher concentration than the first region, and wherein the second crystalline semiconductor layer has at least a channel region, and a third region comprising an n-type impurity element and a p-type impurity element adjacent to the channel region.

8. A semiconductor device comprising:

first and second crystalline semiconductor layers over a substrate, the first and second crystalline semiconductor layers containing a catalytic element that accelerates a crystallization of a semiconductor film;

first and second gate electrodes each adjacent to the first and second crystalline semiconductor layers with a gate insulating film interposed therebetween;

an interlayer insulating film covering at least the first and second crystalline semiconductor layers and the first and second gate electrodes;

a contact hole in the interlayer insulating film;

wherein the first crystalline semiconductor layer has at least a channel region, a first region comprising an n-type impurity element adjacent to the channel region, and a second region comprising a p-type impurity element adjacent to the first region, wherein the second region contains the catalytic element at a higher concentration than the first region;

wherein the second crystalline semiconductor layer has at least a channel region, and a third region comprising an n-type impurity element and a p-type impurity element adjacent to the channel region, and wherein the contact hole is formed so as to reach the first region.

9. A semiconductor device according to any one of claims 1 to 8, wherein the catalytic element comprises at least one element selected from the group consisting of Fe, Co, Ni, Pd, Pt, Cu, and Au.

10. A semiconductor device according to any one of claims 1 to 8, wherein the p-type impurity element comprises at least one element selected from the group consisting of B, Al, Ga, and In.

11. A semiconductor device according to any one of claims 1 to 8, wherein the n-type impurity element comprises at least one element selected from the group consisting of P, As, and Sb.

12. A semiconductor device according to any one of claims 1, 5–8 wherein a concentration of the p-type impurity element is 1 to 3 times higher than a concentration of the n-type impurity element.

13. A semiconductor device according to any one of claims 1 to 8, wherein the semiconductor device is used in at least one selected from the group consisting of a personal computer, a video camera, a mobile computer, a goggle type display, a player using a recording medium, a portable telephone, and a projector.

* * * * *